(12) United States Patent
Kim et al.

(10) Patent No.: US 11,404,508 B2
(45) Date of Patent: Aug. 2, 2022

(54) DISPLAY DEVICE AND METHOD THEREOF OF REDUCED MASKS

(71) Applicant: Samsung Display Co., LTD., Yongin-si (KR)

(72) Inventors: Myeong Ho Kim, Hwaseong-si (KR); Jay Bum Kim, Yongin-si (KR); Kyoung Seok Son, Seoul (KR); Seung Jun Lee, Suwon-si (KR); Seung Hun Lee, Seoul (KR); Jun Hyung Lim, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/877,977

(22) Filed: May 19, 2020

(65) Prior Publication Data

US 2021/0050398 A1 Feb. 18, 2021

(30) Foreign Application Priority Data

Aug. 16, 2019 (KR) .................. 10-2019-0100276

(51) Int. Cl.
*H01L 29/08* (2006.01)
*H01L 27/32* (2006.01)
*H01L 51/56* (2006.01)
*H01L 29/786* (2006.01)

(52) U.S. Cl.
CPC ...... *H01L 27/3258* (2013.01); *H01L 27/3246* (2013.01); *H01L 27/3262* (2013.01); *H01L 27/3265* (2013.01); *H01L 27/3276* (2013.01); *H01L 29/78633* (2013.01); *H01L 51/56* (2013.01); *H01L 2251/303* (2013.01)

(58) Field of Classification Search
CPC .................. H01L 27/3258; H01L 27/3265
USPC ........................................... 257/40
See application file for complete search history.

(56) References Cited

U.S. PATENT DOCUMENTS

| | | | |
|---|---|---|---|
| 2016/0190221 A1* | 6/2016 | Cho | H01L 27/3262 257/40 |
| 2016/0372497 A1* | 12/2016 | Lee | H01L 27/1222 |
| 2018/0076238 A1* | 3/2018 | Lim | H01L 27/1255 |
| 2019/0006521 A1 | 1/2019 | Noh et al. | |
| 2019/0252479 A1* | 8/2019 | Kang | H01L 27/3262 |
| 2019/0288046 A1* | 9/2019 | Park | H01L 51/5228 |

FOREIGN PATENT DOCUMENTS

| | | |
|---|---|---|
| JP | 5095864 | 12/2012 |
| KR | 10-2007-0053902 | 5/2007 |
| KR | 10-2007-0072207 | 7/2007 |
| KR | 10-2016-0098601 | 8/2016 |
| KR | 10-2018-0026610 | 3/2018 |

* cited by examiner

*Primary Examiner* — Phuc T Dang
(74) *Attorney, Agent, or Firm* — Kile Park Reed & Houtteman PLLC

(57) ABSTRACT

A display device and a method of manufacturing a display device are provided. A display device includes a first conductive layer on a first gate insulating film and including a first gate electrode and a first electrode of a capacitor connected to the first gate electrode, and a second conductive layer on the second interlayer insulating film and including a first and a second source/drain electrode, and a second electrode of the capacitor, the second electrode of the capacitor is in a trench structure in which the second interlayer insulating film is partially removed.

14 Claims, 30 Drawing Sheets

FIG. 2
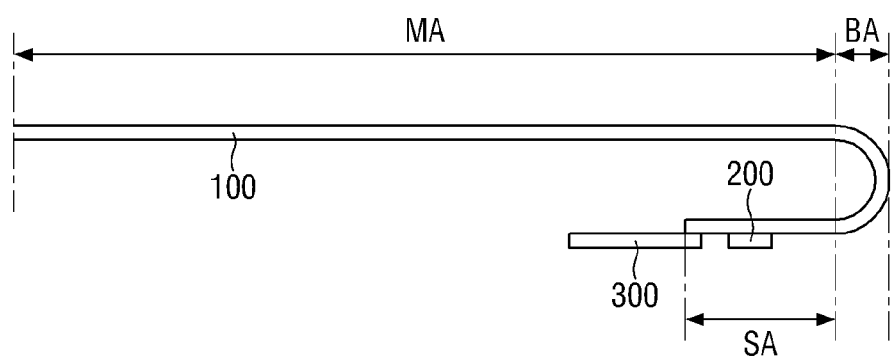
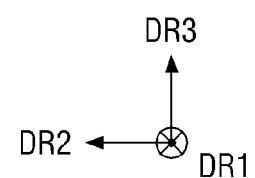

DISPLAY DEVICE AND METHOD THEREOF OF REDUCED MASKS

CROSS-REFERENCE TO RELATED APPLICATIONS

This application claims priority to and benefits of Korean Patent Application No. 10-2019-0100276 under 35 U.S.C. § 119, filed in the Korean Intellectual Property Office on Aug. 16, 2019, the entire contents of which are incorporated herein by reference.

BACKGROUND

1. Technical Field

The disclosure relates to a display device.

2. Description of the Related Art

Display devices are becoming increasingly important with the development of multimedia. In response to the development of multimedia, various types of display devices such as a liquid crystal display (LCD), an organic light-emitting diode (OLED) display, and other types of displays are being developed. Among the display devices, the OLED display displays an image using OLEDs that generate light by recombining electrons and holes. The OLED display may include transistors that may provide a driving current to the OLED.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device in which the number of masks used in a manufacturing process may be reduced.

Aspects of the disclosure also provide a method of manufacturing a display device in which the number of masks used in a manufacturing process may be reduced.

The scope of the disclosure, however, is not limited to the above-described objects, and other aspects and objects may be clearly understood by those skilled in the art from the following descriptions.

An embodiment of a display device may include a substrate; a first semiconductor pattern disposed on the substrate; a first gate insulating film disposed on the first semiconductor pattern; a first conductive layer disposed on the first gate insulating film and including: a first gate electrode; and a first electrode of a capacitor connected to the first gate electrode; a first interlayer insulating film disposed on the first conductive layer; a second semiconductor pattern disposed on the first interlayer insulating film; a second gate insulating film disposed on the second semiconductor pattern; a second gate electrode disposed on the second gate insulating film; a second interlayer insulating film disposed on the second gate electrode; and a second conductive layer disposed on the second interlayer insulating film and including: a first source/drain electrode; a second source/drain electrode; and a second electrode of the capacitor, wherein the second electrode of the capacitor may be disposed in a trench structure in which the second interlayer insulating film may be partially removed.

In an embodiment, the first interlayer insulating film may be disposed between the first electrode and the second electrode of the capacitor without the second interlayer insulating film.

In an embodiment, a thickness of the first interlayer insulating film between the first electrode and the second electrode of the capacitor may be less than a thickness of the first interlayer insulating film in a region in which the first interlayer insulating film does not overlap the second conductive layer.

In an embodiment, a thickness of the second interlayer insulating film between the first electrode and the second electrode of the capacitor may be less than a thickness of the second interlayer insulating film in a region in which the second interlayer insulating film does not overlap the second conductive layer.

In an embodiment, a sidewall of the trench structure may be formed of the second interlayer insulating film; and a bottom surface of the trench structure may be formed of a portion of the first interlayer insulating film.

In an embodiment, a sidewall and a bottom surface of the trench structure may be formed of the second interlayer insulating film.

In an embodiment, the first conductive layer may further include a light-shielding pattern which may be coplanar with the first gate electrode and may overlap the second semiconductor pattern.

In an embodiment, the light-shielding pattern may be connected to the second gate electrode or may be connected to one of the first and second source/drain electrodes.

In an embodiment, the embodiment may further include a third semiconductor pattern, wherein a bottom surface of the trench structure may be formed of the third semiconductor pattern, and the third semiconductor pattern may be in contact with the second electrode of the capacitor and may be disposed between the second electrode of the capacitor and the first interlayer insulating film.

In an embodiment, the second semiconductor pattern may include a channel region which may overlap the second gate electrode; and a source/drain region disposed on an outer side of the second gate electrode, and the source/drain region and the third semiconductor pattern may have a conductivity greater than that of the channel region.

In an embodiment, the third semiconductor pattern may have a same conductivity as the source/drain region.

In an embodiment, a display device may include a first transistor including a non-oxide semiconductor; a second transistor including an oxide semiconductor disposed on a different layer from the non-oxide semiconductor; and a capacitor, a first conductive layer including a first electrode of the capacitor and a gate electrode of the first transistor; a second conductive layer including a gate electrode of the second transistor; and a third conductive layer including a source/drain electrode of the first transistor, a source/drain electrode of the second transistor, and a second electrode of the capacitor; wherein the second electrode of the capacitor may be disposed in a trench structure formed of an insulating layer.

In an embodiment, one of the first transistor and the second transistor may be a p-type metal-oxide-semiconductor (PMOS) transistor, and the other thereof may be an n-type metal-oxide-semiconductor (NMOS) transistor.

In an embodiment, the insulating layer may include: a first insulating layer; and a second insulating layer disposed on the first insulating layer, and the trench structure may include: a side wall formed of the second insulating layer; and a bottom surface formed of a portion of the first insulating layer.

An embodiment of a method of manufacturing a display device may include forming a first semiconductor pattern on a substrate; forming a first gate insulating film on the first semiconductor pattern; forming a first conductive layer on the first gate insulating film, comprising: forming a first gate electrode; and forming a first electrode of a capacitor connected to the first gate electrode; forming a first interlayer insulating film on the first gate electrode and the first electrode of the capacitor; forming a second semiconductor pattern on the first interlayer insulating film; forming an insulating layer of a second gate insulating film on the second semiconductor pattern; forming a second conductive layer on the insulating layer of the second gate insulating film; etching the second conductive layer and the insulating layer of the second gate insulating film with a first etching mask and forming a second gate electrode and a second gate insulating film; forming a second interlayer insulating film on the second gate electrode; etching the second interlayer insulating film, the first interlayer insulating film, and the first gate insulating film with a second etching mask and forming a contact hole which exposes a source/drain region of the first semiconductor pattern; etching the second interlayer insulating film with a third etching mask and forming a trench structure overlapping the first electrode of the capacitor, and a contact hole which exposes a source/drain region of the second semiconductor pattern; and forming a third conductive layer on the second interlayer insulating film, comprising: forming a first source/drain electrode; forming a second source/drain electrode; and forming a second electrode of the capacitor disposed in the trench structure on the second interlayer insulating film.

In an embodiment, the forming the first interlayer insulating film may include forming the first interlayer insulating film between the first electrode and the second electrode of the capacitor without the second interlayer insulating film.

In an embodiment, the forming the first interlayer insulating film may include forming a thickness of the first interlayer insulating film between the first electrode and the second electrode of the capacitor less than a thickness of the first interlayer insulating film in a region in which the first interlayer insulating film does not overlap the third conductive layer.

In an embodiment, the forming the second semiconductor pattern may include forming a third semiconductor pattern which may overlap the first electrode of the capacitor.

In an embodiment, the forming the trench structure may include exposing the third semiconductor pattern.

In an embodiment, the forming the second electrode of the capacitor may include forming the second electrode of the capacitor in contact with the third semiconductor pattern.

According to the display device according to an embodiment and a method of manufacturing a display device, the number of masks may be reduced, thereby reducing process costs and increasing process efficiency.

Effects according to the embodiments of the disclosure are not limited by the content exemplified above, and more various effects are included in the spirit and scope of the specification.

BRIEF DESCRIPTION OF THE DRAWINGS

The above and other aspects and features of the disclosure will become more apparent by describing embodiments thereof in detail with reference to the attached drawings, in which:

FIG. 2 is a side view of the display device of FIG. 1;

DETAILED DESCRIPTION OF THE EMBODIMENTS

Figure 1:
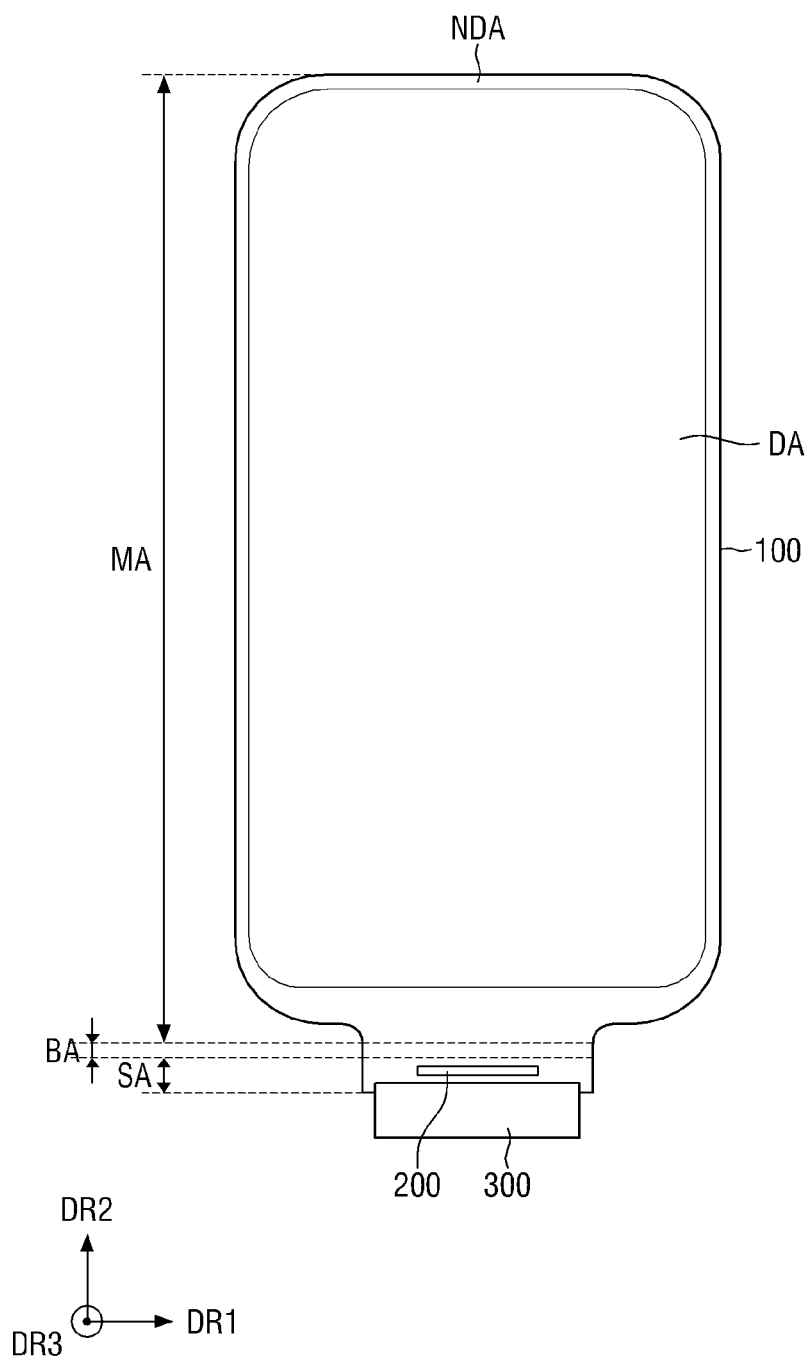
FIG. 1 is a plan view of a display device according to an embodiment.

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Some of the parts which are not associated with the description may not be provided in order to describe embodiments of the disclosure and like reference numerals refer to like elements throughout the specification.

In the drawings, sizes and thicknesses of elements may be enlarged for better understanding clarity and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

Embodiments of the disclosure will hereinafter be described with reference to the accompanying drawings.

FIG. 1 is a plan view of a display device according to an embodiment. FIG. 2 is a side view of the display device of FIG. 1. FIG. 2 illustrates a shape of a side surface of the display device which is bent in a thickness direction thereof.

A display device 1 may be a device for displaying moving images or still images, and the display device 1 may be used as display screens of portable electronic devices, such as mobile phones, smart phones, tablet personal computers (PCs), smart watches, watch phones, mobile communication terminals, electronic notebooks, e-books, portable multimedia players (PMPs), navigation systems, and ultra-mobile PCs (UMPCs), and used for display screens of various products such as televisions, laptop computers, monitors, billboards, and the Internet of Things. However, the disclosure is not limited thereto. Other display devices may also be included within the spirit and scope of the disclosure.

The display device 1 according to an embodiment may have a substantially rectangular shape in the plan view. The display device 1 may have a rectangular shape of which a corner may be a right angle in the plan view. However, the disclosure is not limited thereto, and the display device 1 may have a rectangular shape of which a corner may be rounded in the plan view.

In the drawings, a first direction DR1 may represent a lateral direction of the display device 1 in the plan view and a second direction DR2 mat represent a longitudinal direction of the display device 1 in the plan view. A third direction DR3 may represent the thickness direction of the display device 1. The first direction DR1 and the second direction DR2 may cross each other perpendicularly, and the third direction DR3 may be a direction crossing a plane in which the first direction DR1 and the second direction DR2 are placed and may cross to be perpendicular to both of the first direction DR1 and the second direction DR2. However, directions to be described in embodiments should be understood to refer to relative directions and the embodiments are not limited to the described directions.

Unless otherwise defined, in this specification, the term "upper portion," "upper surface," or "upper side" represented with respect to the third direction DR3 may refer to a side of a display surface with respect to a display panel 100, and the term "lower portion," "lower surface," or "lower side" may refer to an opposite side of the display surface with respect to the display panel 100.

Referring to FIGS. 1 and 2, the display device 1 may include the display panel 100. The display panel 100 may be a flexible substrate including a flexible polymer material such as polyimide or other material within the scope of the disclosure. Accordingly, the display panel 100 may be flexible, bendable, foldable, or rollable.

The display panel 100 may be an organic light-emitting display panel. In the following embodiment, an example in which an organic light-emitting display panel is applied as the display panel 100 is illustrated, but the disclosure is not limited thereto, and other types of display panels, such as a liquid crystal display (LCD), a quantum dot organic light-emitting display panel (QD-OLED), a quantum dot LCD (QD-LCD), a quantum nano light-emitting display panel (a nano-emissive display (NED)), a micro LED, and other types of display panels may be applied as the display panel 100.

The display panel 100 may include a display region DA in which an image or images may be displayed on a screen and a non-display region NDA in which an image or images are not displayed on the screen. The display panel 100 may be divided into the display region DA and the non-display region NDA in the plan view. The non-display region NDA may be located or disposed to surround the display region DA. The non-display region NDA may form a bezel or a rim.

The display region DA may have a rectangular shape of which a corner may be a right angle in the plan view or may have a rectangular shape of which a corner may be rounded in the plan view. The display region DA may have short sides and long sides. The short sides of the display region DA may be sides extending in the first direction DR1. The long sides of the display region DA may be sides extending in the second direction DR2. However, a planar shape of the display region DA is not limited to the rectangular shape, but may be a circular or elliptical shape, or various other shapes.

The display region DA may include pixels. The pixels may be arranged in a matrix form or shape. Each of the pixels may include a light-emitting layer and a circuit layer which may control a light emission amount of the light-emitting layer. The circuit layer may include a line, an electrode, and at least one transistor. The light-emitting layer may include an organic light-emitting material. The light-emitting layer may be sealed by an encapsulation film. A detailed configuration of the pixel will be described below.

The non-display region NDA may be located or disposed adjacent to two short sides and two long sides of the display region DA. In this case, the non-display region NDA may surround all the sides of the display region DA and form an edge of the display region DA. However, the disclosure is not limited thereto, and the non-display region NDA may be located or disposed adjacent only to two short sides or two long sides of the display region DA.

The display panel 100 may include a main region MA and a bending region BA connected to a side of the main region MA in the second direction DR2. The display panel 100 may include a subregion SA of which one side may be connected to the bending region BA in the second direction DR2 and which may be bent in the thickness direction thereof to overlap or partially overlap the main region MA in the thickness direction.

The display region DA may be located or disposed in the main region MA. The non-display region NDA may be located or disposed in a peripheral edge portion of the display region DA of the main region MA.

The main region MA may have a shape similar to that of an exterior of the display device 1 in the plan view. The main region MA may be a flat region located or disposed in or on one surface. However, the disclosure is not limited thereto, and at least one of the remaining edges except for the edge (or side) of the main region MA connected to the bending region BA may be curved to form a curved surface or may be bent in a vertical direction.

When at least one of the remaining edges except for the edge (or side) of the main region MA connected to the bending region BA is curved or bent, the display region DA may also be located or disposed at a corresponding edge. However, the disclosure is not limited thereto, and the non-display region NDA in which the screen may not be displayed may be located or disposed at the curved or bent edge or the display region DA and the non-display region NDA may be located or disposed together at the curved or bent edge.

The non-display region NDA of the main region MA may be placed on a region extending from an outer boundary of the display region DA to an edge of the display panel 100. Signal lines for applying signals to the display region DA or driving circuits may be located or disposed in the non-display region NDA of the main region MA.

The bending region BA may be connected to one short side of the main region MA. A width (a width in the first direction DR1) of the bending region BA may be smaller than a width (a width of the short side) of the main region MA. A connection portion between the main region MA and the bending region BA may have an L-shaped cut shape in order to reduce a width of a bezel.

In the bending region BA, the display panel 100 may be bent with a curvature in a direction opposite to a direction of a display surface thereof. Since the display panel 100 may be bent in the bending region BA, a surface of the display panel 100 may be reversed. For example, one surface of the display panel 100 facing upward may face an outer side of a side surface of the display panel 100 through the bending region BA and then may be changed to face downward.

The subregion SA may extend from the bending region BA. The subregion SA may extend from a bending end point in a direction parallel to the main region MA. The subregion SA may overlap the main region MA in the thickness direction of the display panel 100. The subregion SA may overlap the non-display region NDA at an edge of the main region MA and may overlap the display region DA of the main region MA. A width of the subregion SA may be identical or similar to the width of the bending region BA, but the disclosure is not limited thereto.

Pad portions may be located or disposed on the subregion SA of the display panel 100. External devices may be mounted on (or attached to) the pad portions. Examples of the external devices may include a driving chip 200, a driving substrate 300 formed as a flexible printed board or a rigid printed board, or the like. For example, a line connection film, a connector, or other external devices may be mounted on the pad portions as the external devices. One or more external devices may be mounted in the subregion SA. For example, as illustrated in FIGS. 1 and 2, the driving chip 200 may be located or disposed in the subregion SA of the display panel 100, and the driving substrate 300 may be attached to an end portion of the subregion SA. As an example, the display panel 100 may include both of a pad portion connected to the driving chip 200 and a pad portion connected to the driving substrate 300. As an example, a driving chip may be mounted on a film and the film may be attached to the subregion SA of the display panel 100.

The driving chip 200 may be mounted on one surface, which may be coplanar with the display surface of the display panel 100. As described above, since the bending region BA may be bent and/or reversed, the driving chip 200 may be mounted on the surface of the display panel 100 facing downward in the thickness direction and thus an upper surface of the driving chip 200 may face downward.

The driving chip 200 may be attached onto the display panel 100 using an anisotropic conductive film or may be attached onto the display panel 100 by ultrasonic bonding, for example. A lateral width of the driving chip 200 may be smaller than a lateral width of the display panel 100. The driving chip 200 may be located or disposed on a central portion of the subregion SA in a lateral direction (the first direction DR1), and left and right edges of the driving chip 200 may be spaced apart from left and right edges of the subregion SA, respectively.

The driving chip 200 may include an integrated circuit which may drive the display panel 100. In an embodiment, the integrated circuit may be a data driving integrated circuit which may generate and provide a data signal, but the disclosure is not limited thereto. The driving chip 200 may be connected to line pads (not illustrated) provided on the pad portions of the display panel 100 to provide data signals to the line pads (not illustrated). The lines connected to the line pads (not illustrated) may extend to the pixels to apply the data signals to the respective pixels.

Figure 3:
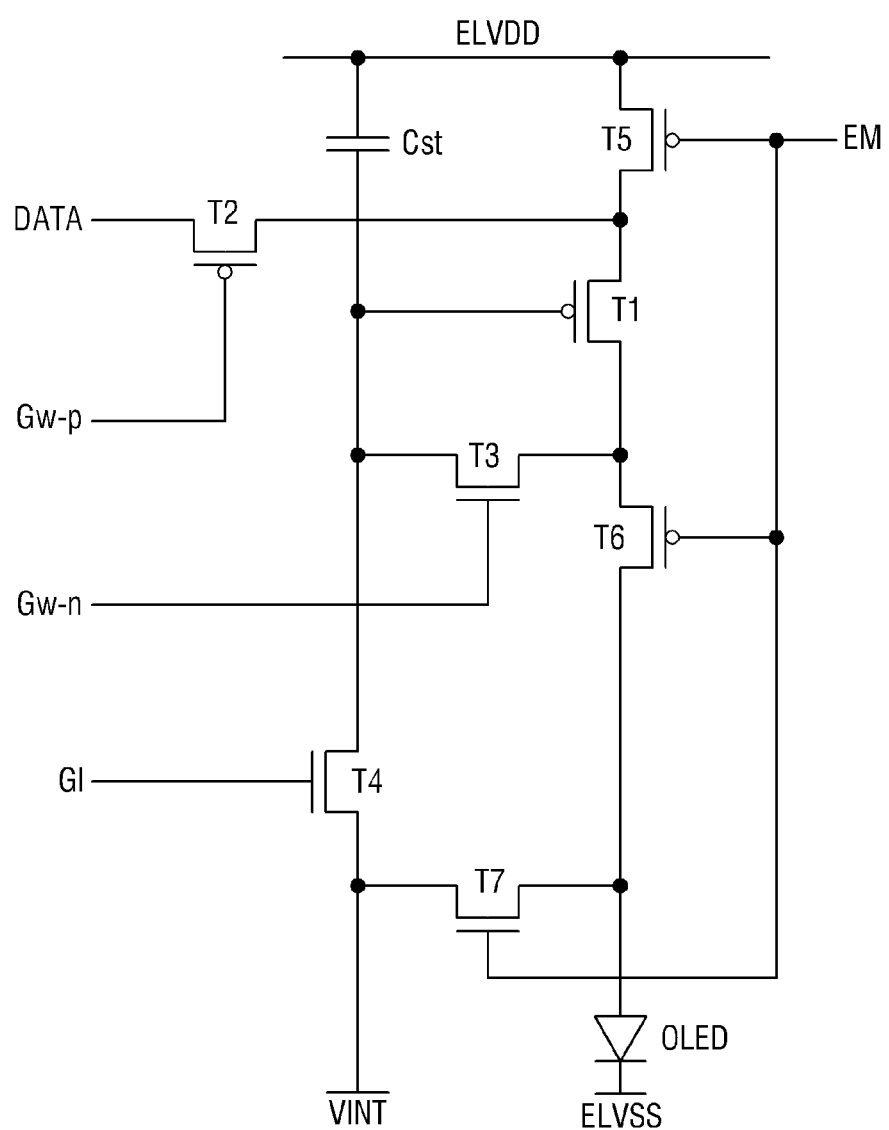
FIG. 3 is an equivalent circuit diagram of one pixel of a display device according to an embodiment.

FIG. 3 is an equivalent circuit diagram of a pixel of a display device according to an embodiment.

Referring to FIG. 3, a circuit of a pixel of an organic light-emitting display device may include an organic light-emitting diode OLED, transistors T1 to T7, and a capacitor Cst. A data signal DATA, a first scan signal Gw-p, a second scan signal Gw-n, a third scan signal GI, a light-emitting control signal EM, a first power voltage ELVDD, a second power voltage ELVSS, and an initialization voltage VINT may be applied to the circuit of a pixel.

The organic light-emitting diode OLED may include an anode electrode and a cathode electrode. The capacitor Cst may include a first electrode and a second electrode.

The transistors may include first to seventh transistors T1 to T7. Each of the transistors T1 to T7 may include a gate electrode, a first source/drain electrode, and a second source/drain electrode. Any one of the first and second source/drain electrodes of each of the transistors T1 to T7 may become a source electrode and the other one may become a drain electrode.

Each of the transistors T1 to T7 may be a thin film transistor. Each of the transistors T1 to T7 may be any one of a p-type metal-oxide-semiconductor (PMOS) transistor or an n-type metal-oxide-semiconductor (NMOS) transistor. In an embodiment, a first transistor T1 serving as a driving transistor, a second transistor T2 serving as a data transfer transistor, a fifth transistor T5 serving as a first light-emitting control transistor, and a sixth transistor T6 serving as a second light-emitting control transistor may be PMOS transistors. On the other hand, a third transistor T3 serving as a compensation transistor, a fourth transistor T4 serving as a first initialization transistor, and a seventh transistor T7 serving as a second initialization transistor may be NMOS transistors. The PMOS transistor and the NMOS transistor may have different characteristics. The third transistor T3, the fourth transistor T4, and the seventh transistor T7 may be formed as NMOS transistors having relatively high turn-off characteristics, and thus a leakage of a driving current Id during an emission period of the organic light-emitting diode OLED may be reduced. However, the disclosure is not limited thereto. The transistors may be any combination of NMOS and or PMOS within the spirt and scope of the disclosure.

Hereinafter, each component will be described in detail.

The gate electrode of the first transistor T1 may be connected to the first electrode of the capacitor Cst. The first source/drain electrode of the first transistor T1 may be connected to a terminal of the first power voltage ELVDD via the fifth transistor T5. The second source/drain electrode of the first transistor T1 may be connected to the anode electrode of the organic light-emitting diode OLED via the sixth transistor T6. The first transistor T1 may receive the data signal DATA according to a switching operation of the second transistor T2 and supply the driving current Id to the organic light-emitting diode OLED.

The gate electrode of the second transistor T2 may be connected to a terminal of the first scan signal Gw-p. The first source/drain electrode of the second transistor T2 may be connected to a terminal of the data signal DATA. The second source/drain electrode of the second transistor T2 may be connected to the terminal of the first power voltage ELVDD via the fifth transistor T5 while being connected to the first source/drain electrode of the first transistor T1. The second transistor T2 may be turned on according to the first scan signal Gw-p to perform the switching operation in which the data signal DATA may be transmitted to the first source/drain electrode of the first transistor T1.

The gate electrode of the third transistor T3 may be connected to a terminal of the second scan signal Gw-n. The first source/drain electrode of the third transistor T3 may be connected to the anode electrode of the organic light-emitting diode OLED via the sixth transistor T6 while being connected to the second source/drain electrode of the first transistor T1. The second source/drain electrode of the third transistor T3 may be connected to the first electrode of the capacitor Cst, the first source/drain electrode of the fourth transistor T4, and the gate electrode of the first transistor T1. The third transistor T3 may be turned on according to the second scan signal Gw-n to connect the gate electrode of the first transistor T1 to the second source/drain electrode and diode-connect the first transistor T1. Accordingly, a voltage difference may be generated between the first source/drain electrode of the first transistor T1 and the gate electrode by a threshold voltage of the first transistor T1. Therefore, the data signal DATA whose threshold voltage may be compensated may be supplied to the gate electrode of the first transistor T1 to compensate for a deviation of the threshold voltage of the first transistor T1.

The gate electrode of the fourth transistor T4 may be connected to a terminal of the third scan signal GI. The second source/drain electrode of the fourth transistor T4 may be connected to a terminal of the initialization voltage VINT. The first source/drain electrode of the fourth transistor T4 may be connected to the first electrode of the capacitor Cst, the second source/drain electrode of the third transistor T3, and the gate electrode of the first transistor T1. The fourth transistor T4 may be turned on according to the third scan signal GI to perform an operation in which the initialization voltage VINT may be transmitted to the gate electrode of the first transistor T1 so that a voltage of the gate electrode of the first transistor T1 may be initialized.

The gate electrode of the fifth transistor T5 may be connected to a terminal of the light-emitting control signal EM. The first source/drain electrode of the fifth transistor T5 may be connected to the terminal of the first power voltage ELVDD. The second source/drain electrode of the fifth transistor T5 may be connected to the first source/drain electrode of the first transistor T1 and the second source/drain electrode of the second transistor T2.

The gate electrode of the sixth transistor T6 may be connected to the terminal of the light-emitting control signal EM. The first source/drain electrode of the sixth transistor T6 may be connected to the second source/drain electrode of the first transistor T1 and the first source/drain electrode of the third transistor T3. The second source/drain electrode of the sixth transistor T6 may be connected to the anode electrode of the organic light-emitting diode OLED.

The fifth transistor T5 and the sixth transistor T6 may be turned on simultaneously according to the light-emitting control signal EM so that the driving current Id may flow into the organic light-emitting diode OLED.

The gate electrode of the seventh transistor T7 may be connected to the terminal of the light-emitting control signal EM. The first source/drain electrode of the seventh transistor T7 may be connected to the anode electrode of the organic light-emitting diode OLED. The second source/drain electrode of the seventh transistor T7 may be connected to the terminal of the initialization voltage VINT. The seventh transistor T7 may be turned on according to the light-emitting control signal EM to initialize the anode electrode of the organic light-emitting diode OLED.

The seventh transistor T7 may receive the same light-emitting control signal EM as the fifth transistor T5 and the sixth transistor T6. However, since the seventh transistor T7 may be the NMOS transistor and the fifth transistor T5 and the sixth transistor T6 may be the PMOS transistors, the seventh transistor T7 may be turned on at a different timing from the fifth transistor T5 and the sixth transistor T6. For example, when the light-emitting control signal EM may be a high level, the seventh transistor T7 may be turned on and the fifth transistor T5 and the sixth transistor T6 may be turned off. When the light-emitting control signal EM may be a low level, the seventh transistor T7 may be turned off and the fifth transistor T5 and the sixth transistor T6 may be turned on. Therefore, the initialization operation by the seventh transistor T7 may not be performed at an emission time point at which the fifth transistor T5 and the sixth transistor T6 may be turned on, and the initialization by the seventh transistor T7 may be performed at a non-emission time point at which the fifth transistor T5 and the sixth transistor T6 may be turned off.

In the embodiment, an example in which the gate electrode of the seventh transistor T7 may receive the light-emitting control signal EM is illustrated. However, as an example, the circuit of the pixel may be configured such that the gate electrode of the seventh transistor T7 may receive the third scan signal GI.

The second electrode of the capacitor Cst may be connected to the terminal of the first power voltage ELVDD. The first electrode of the capacitor Cst may be connected to the gate electrode of the first transistor T1, the second source/drain electrode of the third transistor T3, and the first source/drain electrode of the fourth transistor T4. The cathode electrode of the organic light-emitting diode OLED may be connected to the terminal of the second power voltage ELVSS. The organic light-emitting diode OLED may receive the driving current Id from the first transistor T1 and may emit light to display an image.

Figure 4:
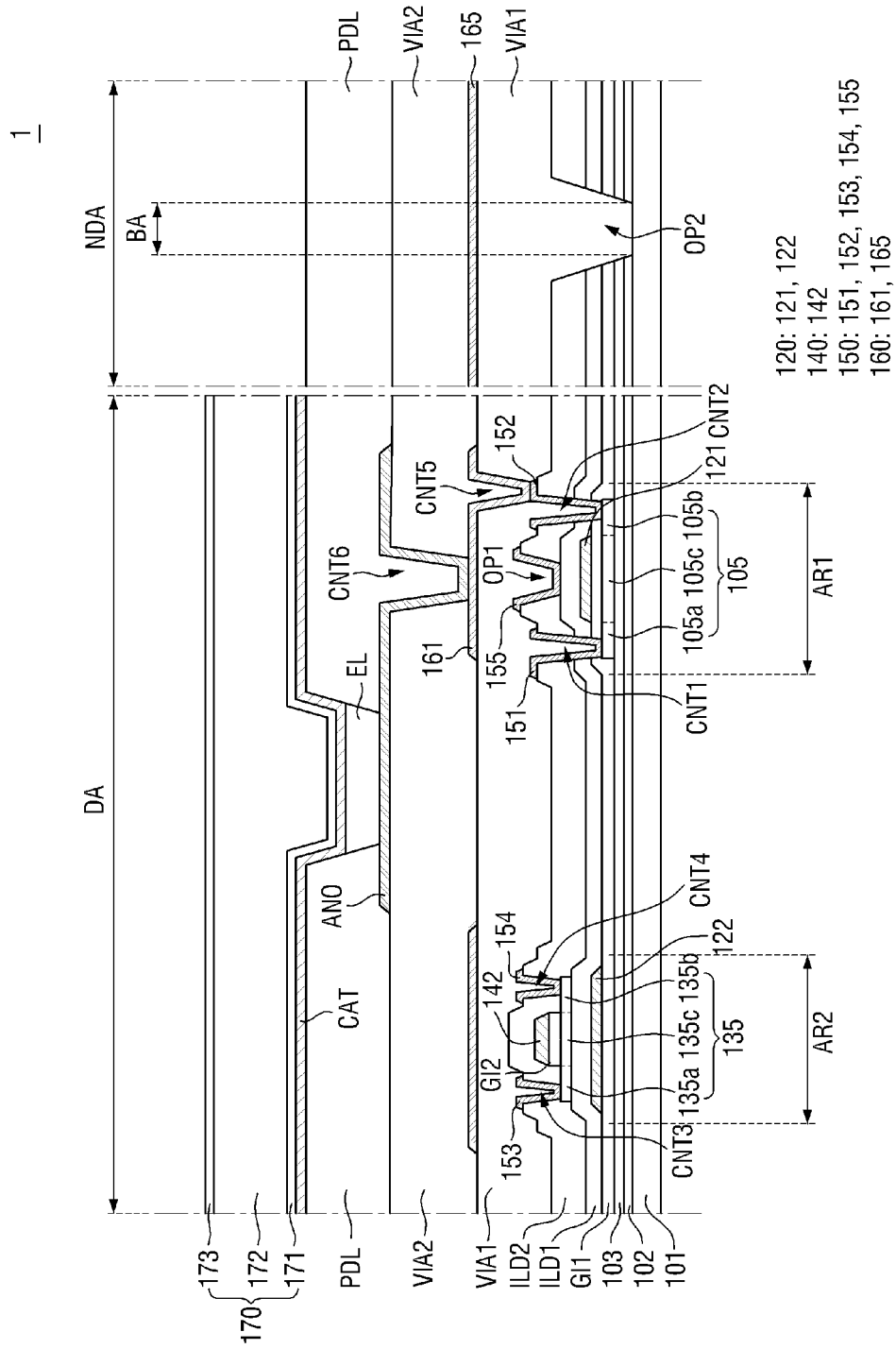
FIG. 4 is a schematic cross-sectional view illustrating a cross section of one pixel and a periphery of a bending region.

Hereinafter, a schematic cross-sectional structure of a display panel 100 will be described in detail with reference to FIG. 4. FIG. 4 illustrates an example of a schematic cross-sectional structure of a pixel of a display region DA of the display panel 100 and a non-display region NDA including a bending region BA.

FIG. 4 is a schematic cross-sectional view illustrating a cross section of a pixel of a display region and a periphery of a bending region.

The display region DA of the display panel 100 will be described with reference to FIG. 4.

The display region DA may include a silicon transistor region AR1 in which a non-oxide inorganic semiconductor transistor (hereinafter, abbreviated as "a silicon transistor") including polycrystalline silicon serving as a channel may be located or disposed, and an oxide transistor region AR2 in which an oxide semiconductor transistor (hereinafter, abbreviated as "an oxide transistor") including an oxide semiconductor serving as a channel may be located or disposed. The silicon transistor located or disposed in the silicon transistor region AR1 may be a PMOS transistor, and in FIG. 4, a first transistor T1 serving as a driving transistor may be illustrated as an example of the silicon transistor. The oxide transistor located or disposed in the oxide transistor region AR2 may be an NMOS transistor, and in FIG. 4, a third transistor T3 serving as a compensation transistor may be illustrated as an example of the oxide transistor. Although not illustrated in FIG. 4, a second transistor T2, a fifth transistor T5, and a sixth transistor T6, which may be other silicon transistors located or disposed in the silicon transistor region AR1, may have substantially the same stacked structure as the first transistor T1. A fourth transistor T4 and a seventh transistor T7, which may be other oxide transistors located or disposed in the oxide transistor region AR2, may have substantially the same stacked structure as the third transistor T3. Detailed descriptions of the silicon transistor and the oxide transistor will be described below.

A base substrate 101, a barrier layer 102, a buffer layer 103, a silicon semiconductor layer 105, a first gate insulating film GI1, a first conductive layer 120, a first interlayer insulating film ILD1, an oxide semiconductor layer 135, a second gate insulating film GI2, a second conductive layer 140, a second interlayer insulating film ILD2, a third conductive layer 150, a first via layer VIA1, a fourth conductive layer 160, a second via layer VIA2, a pixel electrode ANO, and a pixel definition film PDL may be sequentially located or disposed in the display region DA of the display panel 100. Each of the above-described layers may be formed as a single film or may be formed as a stacked film including multiple films. Another layer may be located or disposed between the layers.

The base substrate 101 may support the respective layers located or disposed there above. The base substrate 101 may be made of, for example, an insulating material such as a polymer resin or other suitable material. Examples of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The base substrate 101 may include a metal material.

The base substrate 101 may be a flexible substrate which may be bendable, foldable, or rollable. An example of the material made of the flexible substrate may include PI, but the disclosure is not limited thereto and any other materials that may achieve bending, folding, or rolling may be included within the spirt and scope of the disclosure.

When an organic light-emitting display device is a backside or double-sided emission type, a transparent substrate may be used. When the organic light-emitting display device is a top emission type, not only a transparent substrate but also a translucent or opaque substrate may be used.

The barrier layer 102 may be located or disposed on the base substrate 101. The barrier layer 102 may prevent the diffusion of impurity ions, prevent the penetration of moisture or external air, and may perform a surface planarization function. The barrier layer 102 may include silicon nitride, silicon oxide, silicon oxynitride, or other materials. The barrier layer 102 may be omitted according to a type of the base substrate 101, process conditions, or other conditions.

The buffer layer 103 may be located or disposed on the barrier layer 102. The buffer layer 103 may include at least one of silicon nitride, silicon oxide, silicon oxynitride, or other materials. The buffer layer 103 may be omitted according to the type of the base substrate 101, the process conditions, or other conditions.

The silicon semiconductor layer 105 may be located or disposed on the buffer layer 103. The silicon semiconductor layer 105 may be located or disposed in the silicon transistor region AR1.

The silicon semiconductor layer 105 may be made of polycrystalline silicon, single crystalline silicon, amorphous silicon, or other suitable materials. In the case where the silicon semiconductor layer 105 is made of polycrystalline silicon, the polycrystalline silicon may be formed by crystallizing amorphous silicon using a crystallization method, such as a rapid thermal annealing (RTA) method, a solid phase crystallization (SPC) method, an excimer laser annealing (ELA) method, a metal induced crystallization (MIC) method, a metal induced lateral crystallization (MILC) method, a sequential lateral solidification (SLS) method, or other suitable methods within the spirit and scope of the disclosure.

The silicon semiconductor layer 105 may include a channel region 105c which may be located or disposed to overlap a first gate electrode 121 there above in the thickness direction thereof, and a first source/drain region 105a and a second source/drain region 105b, which respectively may be located or disposed on one side and the other side, or opposite sides, of the channel region 105c. The first and second source/drain regions 105a and 105b of the silicon semiconductor layer 105 may include carrier ions, and thus may have higher conductivity and lower electrical resistance than the channel region 105c.

The silicon semiconductor layer 105 may be a semiconductor layer of each of the first transistor T1, the second transistor T2, the fifth transistor T5, and the sixth transistor T6, which are described above, and may form a channel of the corresponding transistor.

The first gate insulating film GI1 may be located or disposed on the silicon semiconductor layer 105. The first gate insulating film GI1 may cover an upper surface of the silicon semiconductor layer 105 except for portions in which contact holes CNT1 and CNT2 may be formed and may also cover side surfaces of the silicon semiconductor layer 105.

The first gate insulating film GI1 may be located or disposed approximately over an entire surface of the base substrate 101.

The first gate insulating film GI1 may include a silicon compound, a metal oxide, or other materials. For example, the first gate insulating film GI1 may include silicon oxide, silicon nitride, silicon oxynitride, aluminum oxide, tantalum oxide, hafnium oxide, zirconium oxide, titanium oxide, or other materials. The above materials may be used alone or in combinations thereof. The first gate insulating film GI1 may be a single film or a multilayered film formed as a stacked film of different materials.

The first conductive layer 120 may be located or disposed on the first gate insulating film GI1. The first conductive layer 120 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 120 may be a single film or a multilayered film.

The first conductive layer 120 may include the first gate electrode 121 located or disposed in the silicon transistor region AR1 and a light-shielding pattern 122 located or disposed in the oxide transistor region AR2. The first gate electrode 121 and the light-shielding pattern 122 may include the same or a similar material.

The first gate electrode 121 may be a gate electrode of a silicon transistor. The first gate electrode 121 may be connected to the first electrode of the capacitor Cst. The first electrode of the capacitor Cst may be formed using the first gate electrode 121 itself, or may be formed using a portion extending from the first gate electrode 121. For example, a portion of a pattern of the first conductive layer 120 may overlap the silicon semiconductor layer 105 to function as the first gate electrode 121 at the corresponding portion, and the other portion of the pattern of the first conductive layer 120 may not overlap the silicon semiconductor layer 105 to function as the first electrode of the capacitor Cst which may overlap a second electrode 155 of the capacitor Cst there above.

The light-shielding pattern 122 may serve to prevent light which may be incident from a lower portion of the display panel 100 from entering the oxide semiconductor layer 135 located or disposed there above. The light-shielding pattern 122 may overlap a channel region 135c of the oxide semiconductor layer 135.

In an embodiment, the light-shielding pattern 122 may be used as another gate electrode of the oxide transistor. For example, the light-shielding pattern 122 may be electrically connected to a second gate electrode 142 or any one of a first source/drain electrode 153 and a second source/drain electrode 154 of the transistor located or disposed in the oxide semiconductor region AR2.

The first interlayer insulating film ILD1 may be located or disposed on the first conductive layer 120. The first interlayer insulating film ILD1 may include a silicon compound, a metal oxide, or other material. For example, the first interlayer insulating film ILD1 may include silicon oxide, silicon nitride, silicon oxynitride, aluminum oxide, tantalum oxide, hafnium oxide, zirconium oxide, titanium oxide, or other material. The above materials may be used alone or in combinations thereof. The first interlayer insulating film ILD1 may be a single film or a multilayered film formed as a stacked film of different materials.

The oxide semiconductor layer 135 may be located or disposed on the first interlayer insulating film ILD1. The oxide semiconductor layer 135 may be located or disposed in the oxide transistor region AR2. The oxide semiconductor layer 135 may include an oxide semiconductor. The oxide semiconductor may include one or more oxides selected from gallium indium zinc oxide (GIZO), zinc (Zn), indium (In), gallium (Ga), tin (Sn) cadmium (Cd), germanium (Ge), hafnium (Hf), or a combination thereof. The oxide semiconductor may include at least one of indium gallium zinc oxide (IGZO), zinc tin oxide (ZTO), indium tin oxide (IZO), or other suitable materials.

The oxide semiconductor layer 135 may include the channel region 135c located or disposed to overlap the second gate electrode 142 there above in the thickness direction thereof and a first source/drain region 135a and a second source/drain region 135b which are respectively located on one side and the other side of, or opposite sides of, the channel region 135c. The first and second source/drain regions 135a and 135b of the oxide semiconductor layer 135 may be conductive regions and may have higher conductivity and lower electrical resistance than the channel region 135c.

The oxide semiconductor layer 135 may be a semiconductor layer of each of the third transistor T3, the fourth transistor T4, and the seventh transistor T7, which are described above, and may form a channel of the corresponding transistor.

The second gate insulating film GI2 may be located or disposed on the oxide semiconductor layer 135. The second gate insulating film GI2 may be located or disposed in a partial region, or, only in a partial region unlike the first gate insulating film GI1. For example, the second gate insulating film GI2 may cover the channel region 135c of the oxide semiconductor layer 135 to expose side surfaces of the first and second source/drain regions 135a and 135b and the oxide semiconductor layer 135. The second gate insulating film GI2 may have a pattern shape substantially the same as that of the second gate electrode 142 there above.

The second gate insulating film GI2 may include a silicon compound, a metal oxide, or other material. For example, the second gate insulating film GI2 may include silicon oxide, silicon nitride, silicon oxynitride, aluminum oxide, tantalum oxide, hafnium oxide, zirconium oxide, titanium oxide, or other material. The above materials may be used alone or in combinations thereof. The second gate insulating film GI2 may be a single film, or a multilayered film formed as a stacked film of different materials.

The second conductive layer 140 may be located or disposed on the second gate insulating film GI2. The second conductive layer 140 may include the second gate electrode 142 of the transistor located or disposed in the oxide transistor region AR2. The second conductive layer 140 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 140 may be a single film or a multilayered film.

The second interlayer insulating film ILD2 may be located or disposed on the second conductive layer 140. The second interlayer insulating film ILD2 may include a silicon compound, a metal oxide, or other material. For example, the second interlayer insulating film ILD2 may include silicon oxide, silicon nitride, silicon oxynitride, aluminum oxide, tantalum oxide, hafnium oxide, zirconium oxide, titanium oxide, or other material. The above materials may be used alone or in combinations thereof. The second interlayer insulating film ILD2 may be a single film or a multilayered film formed as a stacked film of different materials.

A trench structure OP1 may be formed in the second interlayer insulating film ILD2. A sidewall of the trench structure OP1 may be formed of the second interlayer insulating film ILD2, and a bottom surface of the trench structure OP1 may be formed of the first interlayer insulating film ILD1. For example, the trench structure OP1 may be formed as an opening of the second interlayer insulating film ILD2, which may partially expose the first interlayer insulating film ILD1. A portion of the first interlayer insulating film ILD1 which may overlap the first gate electrode 121 may be exposed even in a state in which the second interlayer insulating film ILD2 may be stacked by the trench structure OP1.

A thickness of the second interlayer insulating film ILD2 may be greater than a thickness of each of the first gate insulating film GI1, the second gate insulating film GI2, and the first interlayer insulating film ILD1 described above. The second interlayer insulating film ILD2 may be formed of the same material or similar material as the first interlayer insulating film ILD1, but the disclosure is not limited thereto.

The third conductive layer 150 may be located or disposed on the second interlayer insulating film ILD2. The third conductive layer 150 may include one or more metals selected from aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 150 may be a single film or a multilayered film.

The third conductive layer 150 may include a first source/drain electrode 151 and a second source/drain electrode 152 of the transistor located or disposed in the silicon transistor region AR1, a second electrode 155 of the capacitor Cst, and a first source/drain electrode 153 and a second source/drain electrode 154 of the transistor located or disposed in the oxide transistor region AR2. For example, the second electrode 155 of the capacitor Cst may be formed on the same layer as a layer on which the first and second source/drain electrodes 151 and 152 of the transistor located or disposed in the silicon transistor region AR1 and the first and second source/drain electrodes 153 and 154 of the transistor located or disposed in the oxide transistor region AR2 may be located or disposed.

In the transistor located or disposed in the silicon transistor region AR1, the first source/drain electrode 151 may be connected to the first source/drain region 105a of the silicon semiconductor layer 105 through a first contact hole CNT1 which may pass through the second interlayer insulating film ILD2, the first interlayer insulating film ILD1, and the first gate insulating film GI1 and which may expose the first source/drain region 105a of the silicon semiconductor layer 105. The second source/drain electrode 152 may be connected to the second source/drain region 105b of the silicon semiconductor layer 105 through a second contact hole CNT2 which may pass through the second interlayer insulating film ILD2, the first interlayer insulating film ILD1, and the first gate insulating film GI1 and which may expose the second source/drain region 105b of the silicon semiconductor layer 105.

In the transistor located or disposed in the oxide transistor region AR2, the first source/drain electrode 153 may be connected to the first source/drain region 135a of the oxide semiconductor layer 135 through a third contact hole CNT3 which may pass through the second interlayer insulating film ILD2 and which may expose the first source/drain region 135a of the oxide semiconductor layer 135. The second source/drain electrode 154 may be connected to the second source/drain region 135b of the oxide semiconductor layer 135 through a fourth contact hole CNT4 which may pass through the second interlayer insulating film ILD2 and which may expose the second source/drain region 135b of the oxide semiconductor layer 135.

The second electrode 155 of the capacitor Cst may be located or disposed on the second interlayer insulating film ILD2. The second electrode 155 of the capacitor Cst may be located or disposed at a higher level than the second gate electrode 142 of the transistor located or disposed in the oxide transistor region AR2. In other words, the second gate electrode 142 may be located or disposed on the oxide semiconductor layer 135 located or disposed on the first interlayer insulating film ILD1 and the second gate insulating film GI2, the second interlayer insulating film ILD2 may be formed on the second gate electrode 142, and the second electrode 155 of the capacitor Cst may be located or disposed on the second interlayer insulating film ILD2.

A portion of the second electrode 155 of the capacitor Cst located or disposed on the second interlayer insulating film ILD2 may be located or disposed in the trench structure OP1. The second electrode 155 of the capacitor Cst may be in direct contact with an upper surface of the first interlayer insulating film ILD1, which may form a bottom surface thereof inside the trench structure OP1. The second electrode 155 of the capacitor Cst in the trench structure OP1 and the first electrode of the capacitor Cst connected to the first gate electrode 121 there below may form a capacitor Cst with the first interlayer insulating film ILD1 interposed therebetween.

As described above, although the second electrode 155 of the capacitor Cst may be located or disposed on the same layer as a layer on which the first and second source/drain electrodes 151 and 152 of the transistor located or disposed in the silicon transistor region AR1 and the first and second source/drain electrodes 153 and 154 of the transistor located or disposed in the oxide transistor region AR2 may be located or disposed, the capacitor Cst may be maintained only by the first interlayer insulating film ILD1 as a dielectric of the capacitor Cst through the trench structure OP1 without the second interlayer insulating film ILD2. Therefore, an interval between the second electrode 155 of the capacitor Cst and the first gate electrode 121 may be reduced, and thus the capacitance of the capacitor Cst may be increased.

As an example, since the second electrode 155 of the capacitor Cst may be located or disposed on the second interlayer insulating film ILD2, two insulating layers (for example, the first interlayer insulating film ILD1 and the second interlayer insulating film ILD2) may be located or disposed between the second electrode 155 of the capacitor Cst and the first gate electrode 121. However, since the second electrode 155 of the capacitor Cst may be located or disposed on the first interlayer insulating film ILD1 through the trench structure OP1 to form the capacitor Cst in the corresponding region, only one insulating layer (for example, the first interlayer insulating film ILD1) may be located or disposed between the second electrode 155 of the capacitor Cst and the first gate electrode 121 so that the capacitance of the capacitor Cst may be further increased.

As an example, in an embodiment, a portion of an upper side of the first interlayer insulating film ILD1 may also be etched while the trench structure OP1 is formed. In this case, a thickness of the dielectric of the capacitor Cst may be reduced so that the capacitance of the capacitor Cst may be further increased.

The second electrode 155 of the capacitor Cst may be formed simultaneously with the first and second source/drain electrodes 151 and 152 of the transistor located or disposed in the silicon transistor region AR1 and the first and second source/drain electrodes 153 and 154 of the transistor located or disposed in the oxide transistor region AR2 using one mask. As described above, since the second electrode 155 of the capacitor Cst may be formed simultaneously with another source/drain electrode using the same mask without being formed by a separate mask process using a separate conductive layer, the number of mask processes may be reduced.

The first via layer VIA1 may be located or disposed on the third conductive layer 150. The first via layer VIA1 may include an inorganic insulating material or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, benzocyclobutene (BCB), or other material. The first via layer VIA1 may be a single film or a multilayered film formed as a stacked film of different materials.

The fourth conductive layer 160 may be located or disposed on the first via layer VIA1. The fourth conductive layer 160 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The fourth conductive layer 160 may be a single film or a multilayered film.

The fourth conductive layer 160 may include a connection electrode 161. The fifth contact hole CNT5 which may expose the second source/drain electrode 152 of the transistor located or disposed in the silicon semiconductor region AR1 may be located or disposed on the first via layer VIA1, and the connection electrode 161 may be connected to the second source/drain electrode 152 through the fifth contact hole CNT5.

The second via layer VIA2 may be located or disposed on the connection electrode 161. The second via layer VIA2 may include an inorganic insulating material or an organic insulating material such as a polyacrylate resin, an epoxy resin, a phenolic resin, a polyamide resin, a polyimide resin, an unsaturated polyester resin, a polyphenylene ether resin, a polyphenylene sulfide resin, BCB, or other material. The second via layer VIA2 may be a single film or a multilayered film formed as a stacked film of different materials.

The pixel electrode ANO may be located or disposed on the second via layer VIA2. The pixel electrode ANO may be an anode electrode. The pixel electrode ANO may be located or disposed separately for each pixel. The pixel electrode ANO may be electrically connected to the connection electrode 161 through a sixth contact hole CNT6 which may pass through the second via layer VIA2 and which may expose a portion of the connection electrode 161.

The pixel electrode ANO is not limited thereto and may have a stacked film structure in which a material layer having a high work function such as indium tin oxide (ITO), indium zinc oxide (IZO), zinc oxide (ZnO), or indium oxide ($In_2O_3$) and a reflective material layer such as silver (Ag), magnesium (Mg), aluminum (Al), platinum (Pt), lead (Pd), gold (Au), nickel (Ni), neodymium (Nd), iridium (Ir), chromium (Cr), or a mixture thereof may be stacked. A layer having a high work function may be located or disposed above the reflective material layer and may be located or disposed close to a light-emitting layer EL. The pixel electrode ANO may have a multilayer structure of ITO/Mg, ITO/MgF, ITO/Ag, and ITO/Ag/ITO, but the disclosure is not limited thereto.

The pixel definition film PDL may be located or disposed on the pixel electrode ANO. The pixel definition film PDL may include an opening which may partially expose the pixel electrode ANO. The pixel definition film PDL may be made of an organic insulating material or an inorganic insulating material. For example, the pixel definition film PDL may include at least one of polyimide resin, acrylic resin, a silicone compound, polyacrylic resin, or other material.

The light-emitting layer EL may be located or disposed on the pixel electrode ANO exposed by the pixel definition film PDL. The light-emitting layer EL may include an organic material layer. The organic material layer of the light-emitting layer may include an organic light-emitting layer and may include a hole injection/transport layer and/or an electron injection/transport layer.

A cathode electrode CAT may be located or disposed on the light-emitting layer EL. The cathode electrode CAT may be a common electrode located or disposed over an entirety of pixels without distinguishing the pixels PX, or as a continuous layer. Each of the pixel electrode ANO, the light-emitting layer EL, and the cathode electrode CAT may form an organic light-emitting diode.

The cathode electrode CAT may include a material layer having a low work function, such as Li, Ca, LiF/Ca, LiF/Al, Al, Mg, Ag, Pt, Pd, Ni, Au, Nd, Ir, Cr, BaF, Ba, a compound thereof, or a mixture (for example, a mixture of Ag and Mg, or other materials) thereof. The cathode electrode CAT may include a transparent metal oxide layer located or disposed on the material layer having the low work function.

The pixel electrode ANO, the light-emitting layer EL, and the cathode electrode CAT may constitute an organic light-emitting element.

A thin film encapsulation layer 170 including a first inorganic film 171, a first organic film 172, and a second inorganic film 173 may be located or disposed above the cathode electrode CAT. The first inorganic film 171 and the second inorganic film 173 may be in contact with each other at an end portion of the thin film encapsulation layer 170. The first organic film 172 may be sealed by the first inorganic film 171 and the second inorganic film 173.

Each of the first inorganic film 171 and the second inorganic film 173 may include silicon nitride, silicon oxide, silicon oxynitride, or other material. The first organic film 172 may include an organic insulating material.

Hereinafter, a non-display region NDA will be described.

The base substrate 101, the barrier layer 102, the buffer layer 103, the first gate insulating film GI1, the first interlayer insulating film ILD1, the second interlayer insulating film ILD2, the first via layer VIA1, the fourth conductive layer 160, the second via layer VIA2, and the pixel definition film PDL may be sequentially located or disposed in the non-display region NDA of the display panel 100. Each of the above-described layers may be formed as a single film or may be formed as a stacked film including multiple films. Another layer may be located or disposed between the layers.

The non-display region NDA may include a bending region BA and a bending opening OP2.

The bending region BA may be a region of the non-display region NDA in which the barrier layer 102, the buffer layer 103, the first gate insulating film GI1, the first interlayer insulating layer ILD1, and the second interlayer insulating layer ILD2 may not be located or disposed and in which the upper surface of the base substrate 101 may be exposed.

In the non-display region NDA, the bending opening OP2 may pass through the barrier layer 102, the buffer layer 103, the first gate insulating film GI1, the first interlayer insulating layer ILD1, and the second interlayer insulating layer ILD2, and a portion of the base substrate 101 may be exposed through the bending opening OP2. In the bending opening OP2, side surfaces of the barrier layer 102, the buffer layer 103, the first gate insulating film GI1, the first interlayer insulating layer ILD1, and the second interlayer insulating layer ILD2 may be exposed. The exposed side surfaces of the barrier layer 102, the buffer layer 103, the first gate insulating film GI1, the first interlayer insulating layer ILD1, and the second interlayer insulating layer ILD2 may be stacked with the arrangement as illustrated in FIG. 4, but the disclosure is not limited thereto.

The bending opening OP2 may be formed by a process of forming first to fourth contact holes CNT1 to CNT4 and a process of forming the trench structure OP1 which will be described below. Due to the formation of the bending opening OP2, bending stress that may occur when the above-described display device 1 may be bent in the bending region BA may be prevented.

The bending opening OP2 may be filled with the first via layer VIA1. The first via layer VIA1 may be located or disposed on the second interlayer insulating film ILD2 in the non-display region NDA and may be located or disposed on the exposed side surfaces of the barrier layer 102, the buffer layer 103, the first gate insulating film GI1, the first interlayer insulating layer ILD1, and the second interlayer insulating layer ILD2 in the bending region BA. The first via layer VIA1 may be in direct contact with the exposed upper surface of the base substrate 101.

In the non-display region NDA and the bending region BA, a connection line 165 may be located or disposed on the first via layer VIAL The connection line 165 may be formed of the fourth conductive layer 160. The connection line 165 may be formed together with the connection electrode 161 described above and may be made of the same material or similar material as the material forming the connection electrode 161.

The second via layer VIA2 and the pixel definition film PDL may be located or disposed on the connection line 165. In the non-display region NDA, at least one of the second via layer VIA2 and the pixel definition film PDL may be omitted.

Hereinafter, a method of manufacturing a display device according to an embodiment will be described.

Figure 5:
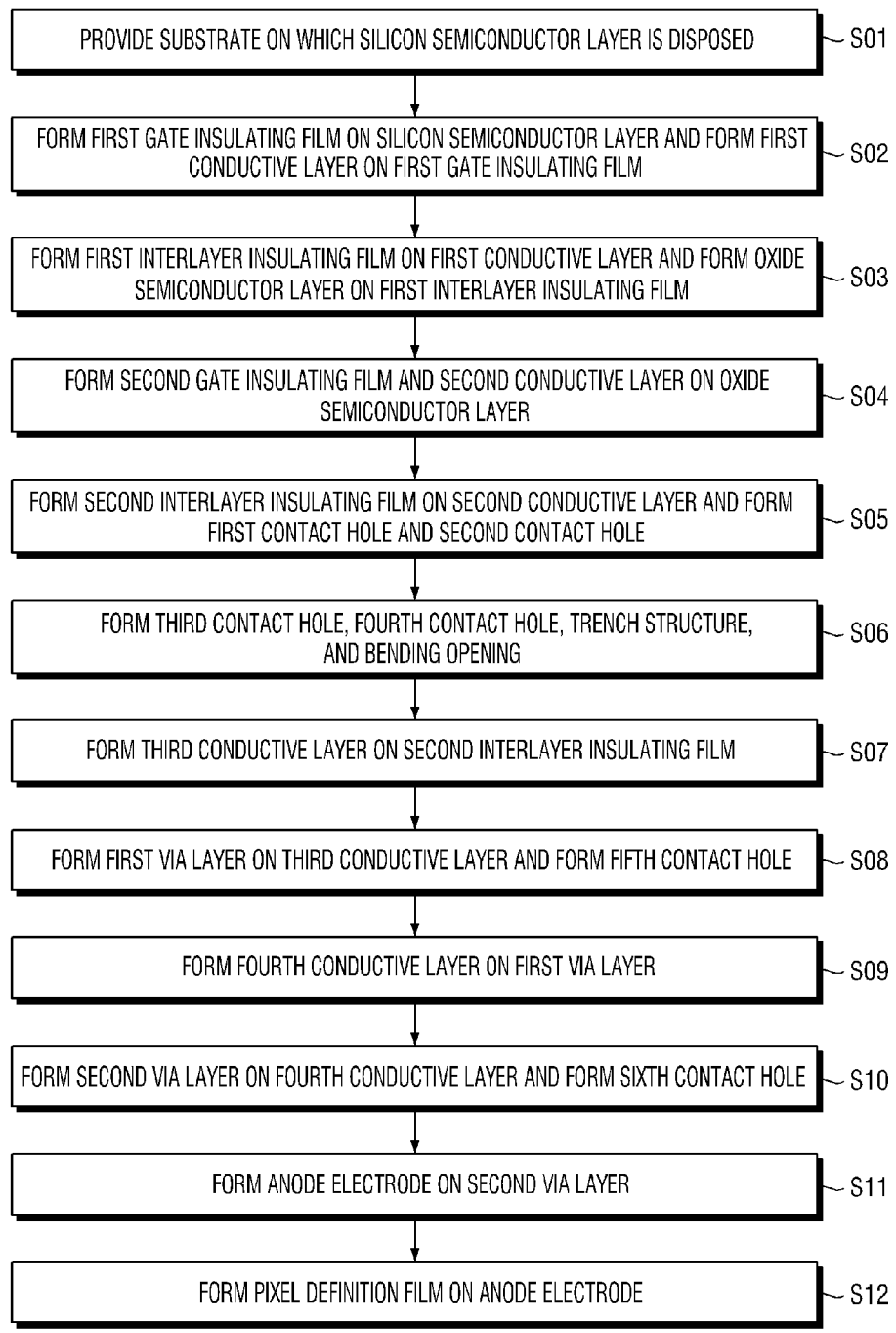
FIG. 5 is a flowchart illustrating a method of manufacturing a display device according to an embodiment.

FIG. 5 is a flowchart illustrating the method of manufacturing a display device according to an embodiment, and FIGS. 6 to 21 are schematic cross-sectional views illustrating process operations of the method of manufacturing a display device according to an embodiment.

Figure 6:
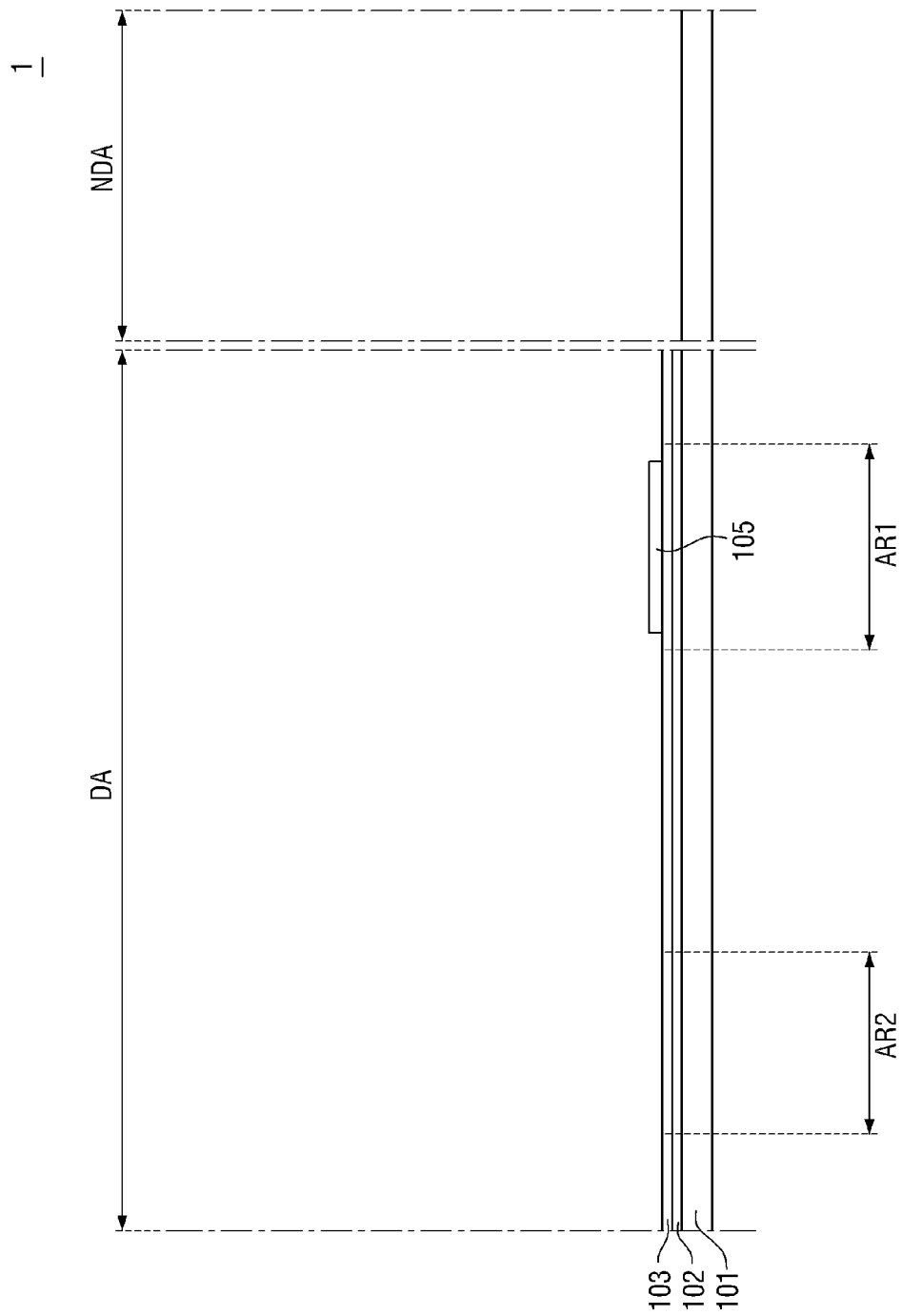
FIGS. 6 to 21 are schematic cross-sectional views illustrating process operations of a method of manufacturing a display device according to an embodiment.

Referring to FIGS. 5 and 6, first, a display region DA including a silicon transistor region AR1 and an oxide transistor region AR2 and a non-display region NDA located or disposed around the display region DA may be defined, and a base substrate 101 on which a silicon semiconductor layer 105 may be located or disposed may be provided in the silicon transistor region AR1 (S01).

A barrier layer 102 and a buffer layer 103 may be sequentially stacked on the base substrate 101, and a silicon semiconductor layer may be formed on the buffer layer 103 and then patterned by a photolithography process so that the silicon semiconductor layer 105 may be formed as illustrated in FIG. 6.

Figure 7:
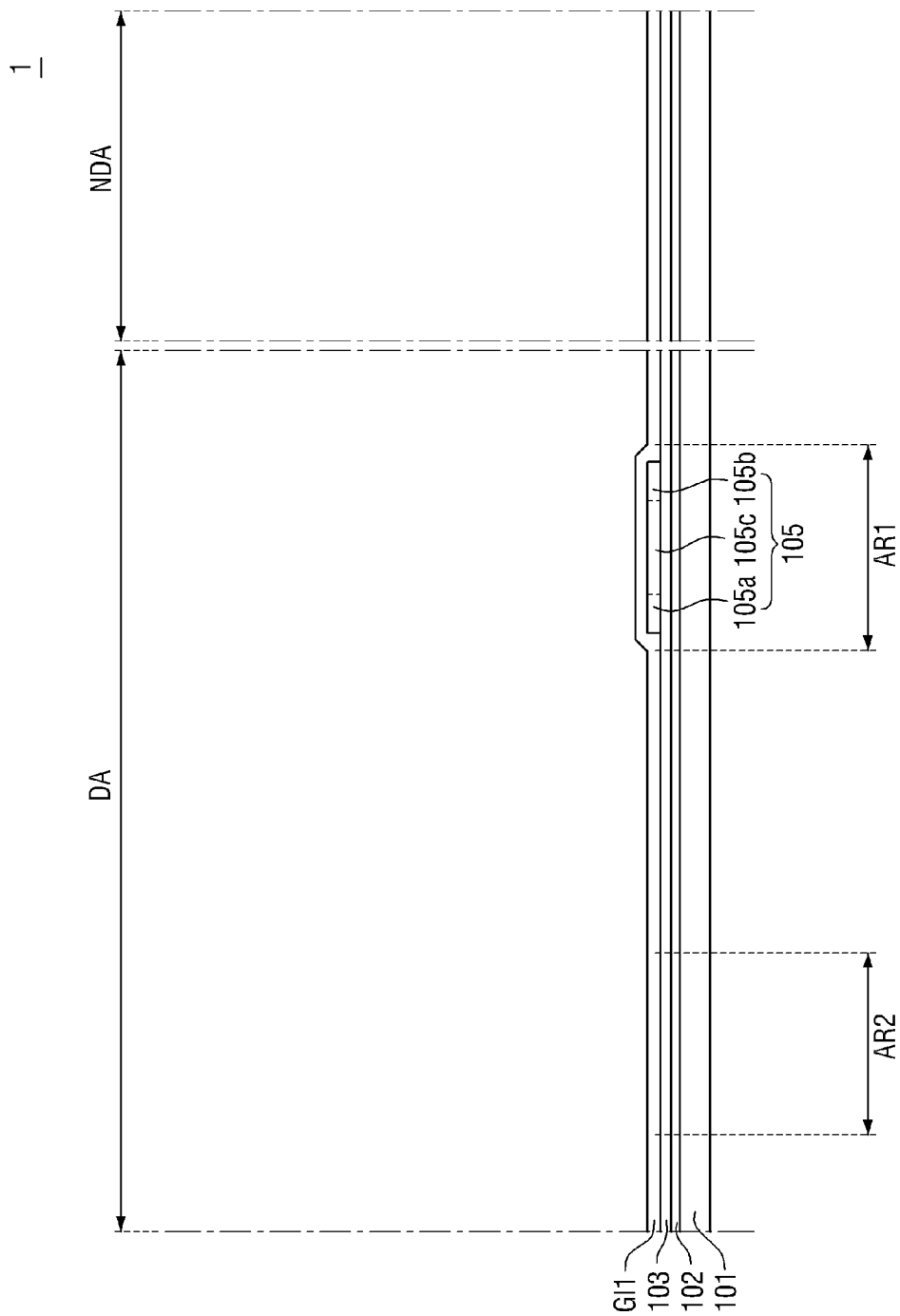
Figure 8:
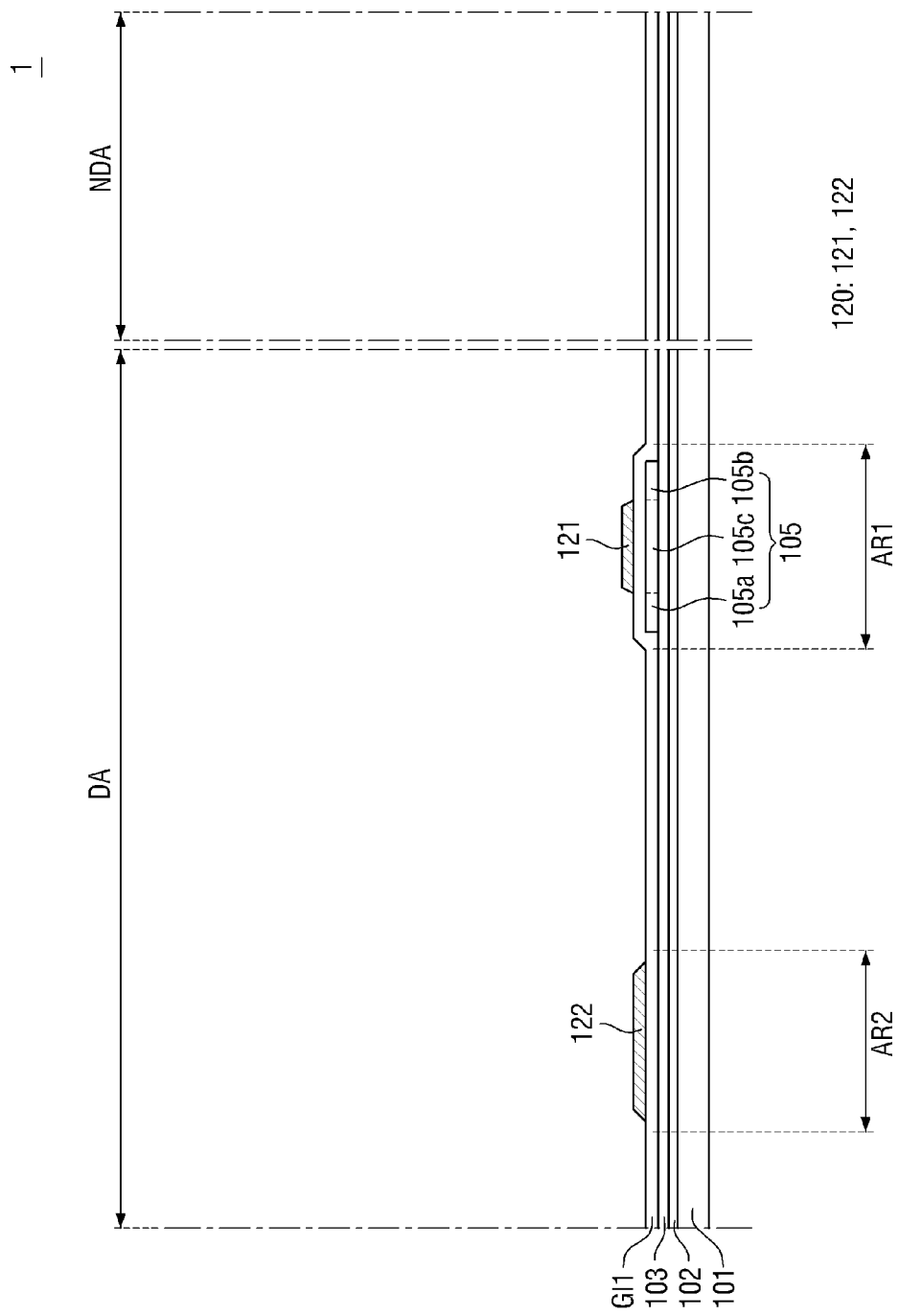

Referring to FIGS. 7 and 8, a first gate insulating film GI1 may be formed on the silicon semiconductor layer 105, and a first conductive layer 120 including a first gate electrode 121 and a light-shielding pattern 122 may be formed on the first gate insulating film GI1 (S02).

The first gate insulating film GI1 may be formed on an entire surface of the buffer layer 103 on which the silicon semiconductor layer 105 may be formed. The first gate electrode 121 and the light-shielding pattern 122 may be simultaneously formed on the first gate insulating film GI1. The patterned first gate electrode 121 and the patterned light-shielding pattern 122 may be formed by one mask process. For example, a material layer for a first conductive layer may be deposited on an entire surface of the first gate insulating film GI1 and then patterned by a photolithography process so that the first gate electrode 121 and the light-shielding pattern 122 may be formed as illustrated in FIG. 8.

Figure 9:
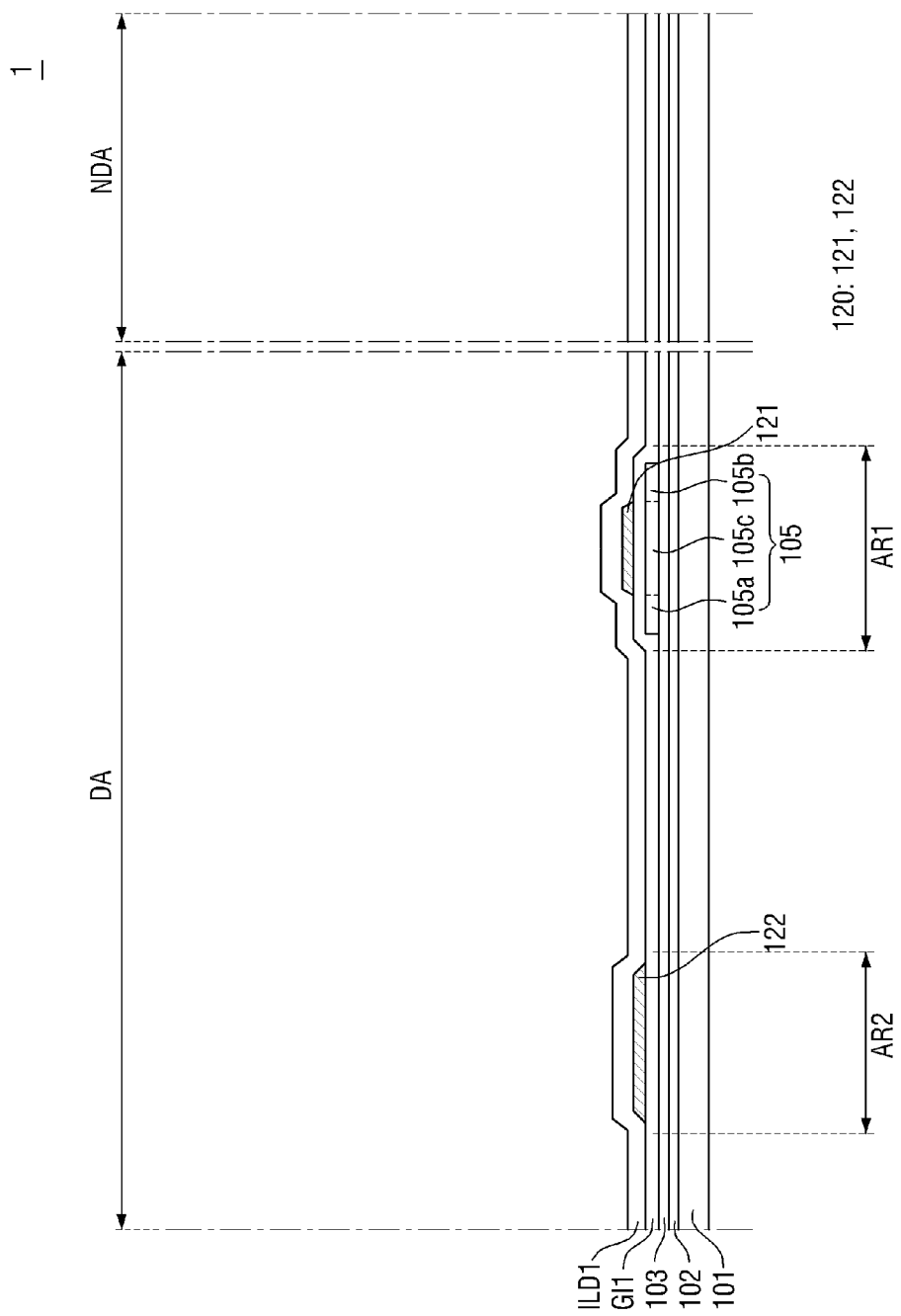
Figure 10:
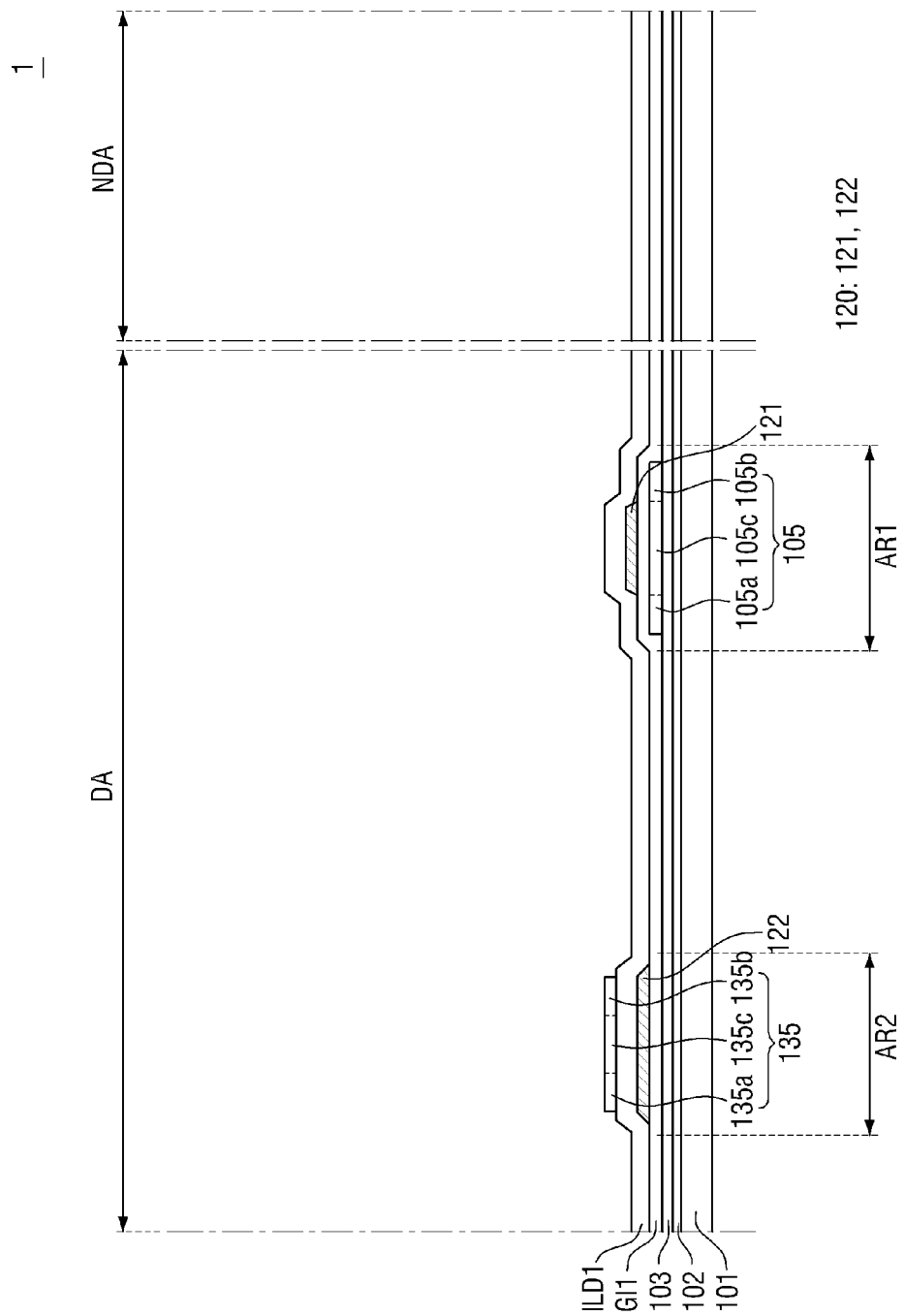

Referring to FIGS. 9 and 10, a first interlayer insulating film ILD1 may be formed on the first gate electrode 121 and the light-shielding pattern 122, and an oxide semiconductor layer 135 may be formed on the first interlayer insulating film ILD1 (S03).

The first interlayer insulating film ILD1 may be formed on an entire surface of the first gate insulating film GI1 on which the first gate electrode 121 and the light-shielding pattern 122 may be formed. The oxide semiconductor layer 135 may be formed on the first interlayer insulating film ILD1. The oxide semiconductor layer 135 may be formed by a mask process. For example, a material layer for an oxide semiconductor layer may be deposited on an entire surface of the first interlayer insulating film ILD1 and then patterned by a photolithography process so that the oxide semiconductor layer 135 may be formed as illustrated in FIG. 10.

Figure 11:
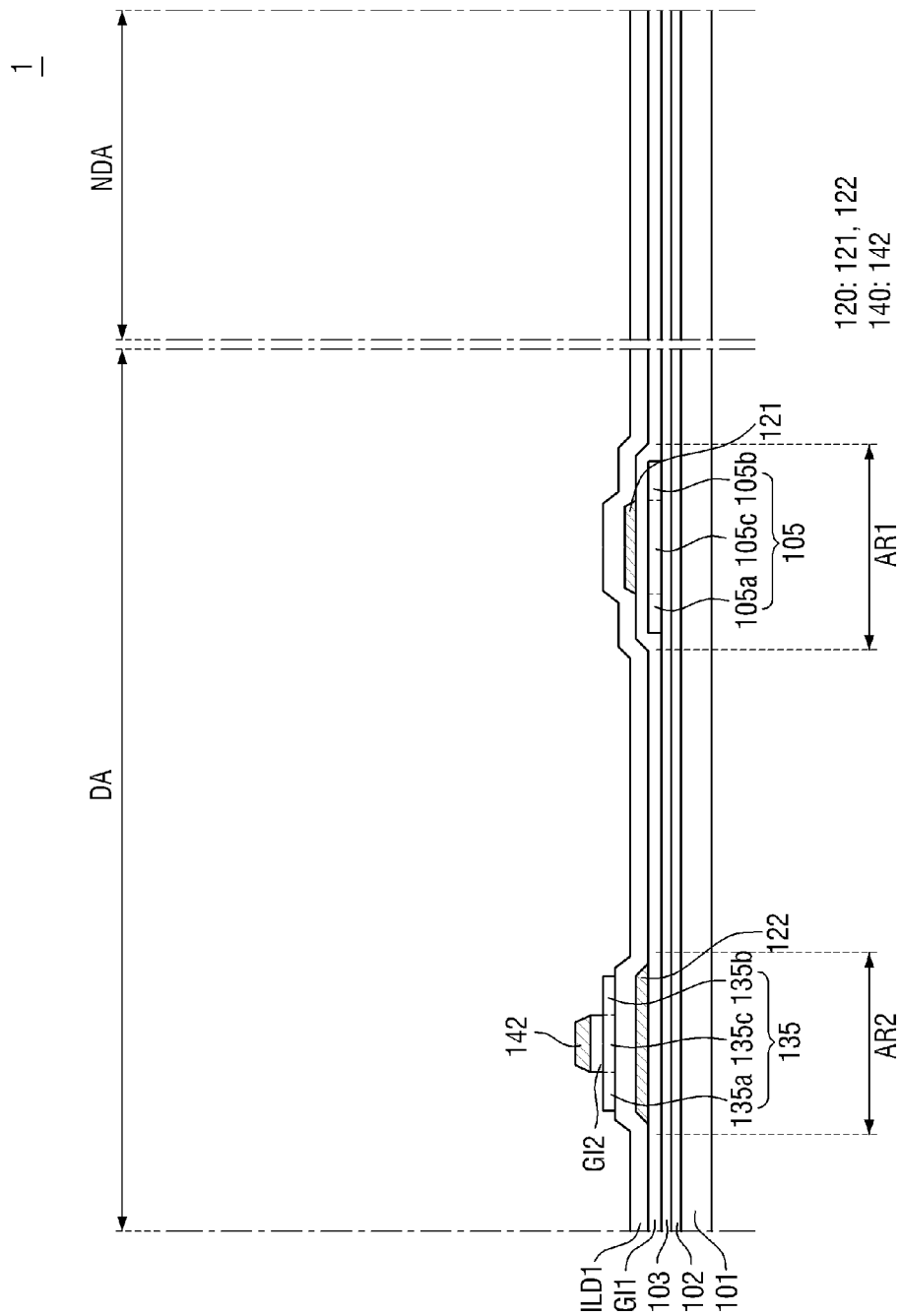

Referring to FIG. 11, a second gate insulating film GI2 may be formed on the oxide semiconductor layer 135 and a second gate electrode 142 is formed on the second gate insulating film GI2 (S04).

The patterned second gate insulating film GI2 and the second gate electrode 142 may be formed by one mask process. A material layer for a second gate insulating film may be deposited on an entire surface of the first interlayer insulating film ILD1 on which the oxide semiconductor layer 135 may be formed, and subsequently, a material layer for a second gate electrode may be deposited on the deposited entire surface of the material layer for the second gate insulating film. The material layer for the second gate electrode may be coated with a photoresist layer, a photoresist pattern may be formed by exposure and development, and the material layer for the second gate electrode and the material layer for the second gate insulating film may be sequentially etched using the photoresist pattern as an etching mask. Thereafter, the photoresist pattern may be removed by a stripping or ashing process. In the above, the case in which the photoresist pattern is used as the etching mask until the second gate insulating film GI2 may be patterned is illustrated. However, the photoresist pattern may be used as a hard mask when a lower layer is etched by a patterned upper layer. In this case, the photoresist pattern may be used as an etching mask together with a hard mask. As an example, after the hard mask is formed, the photoresist pattern may be removed and a lower layer may be etched using the hard mask as the etching mask.

Figure 12:
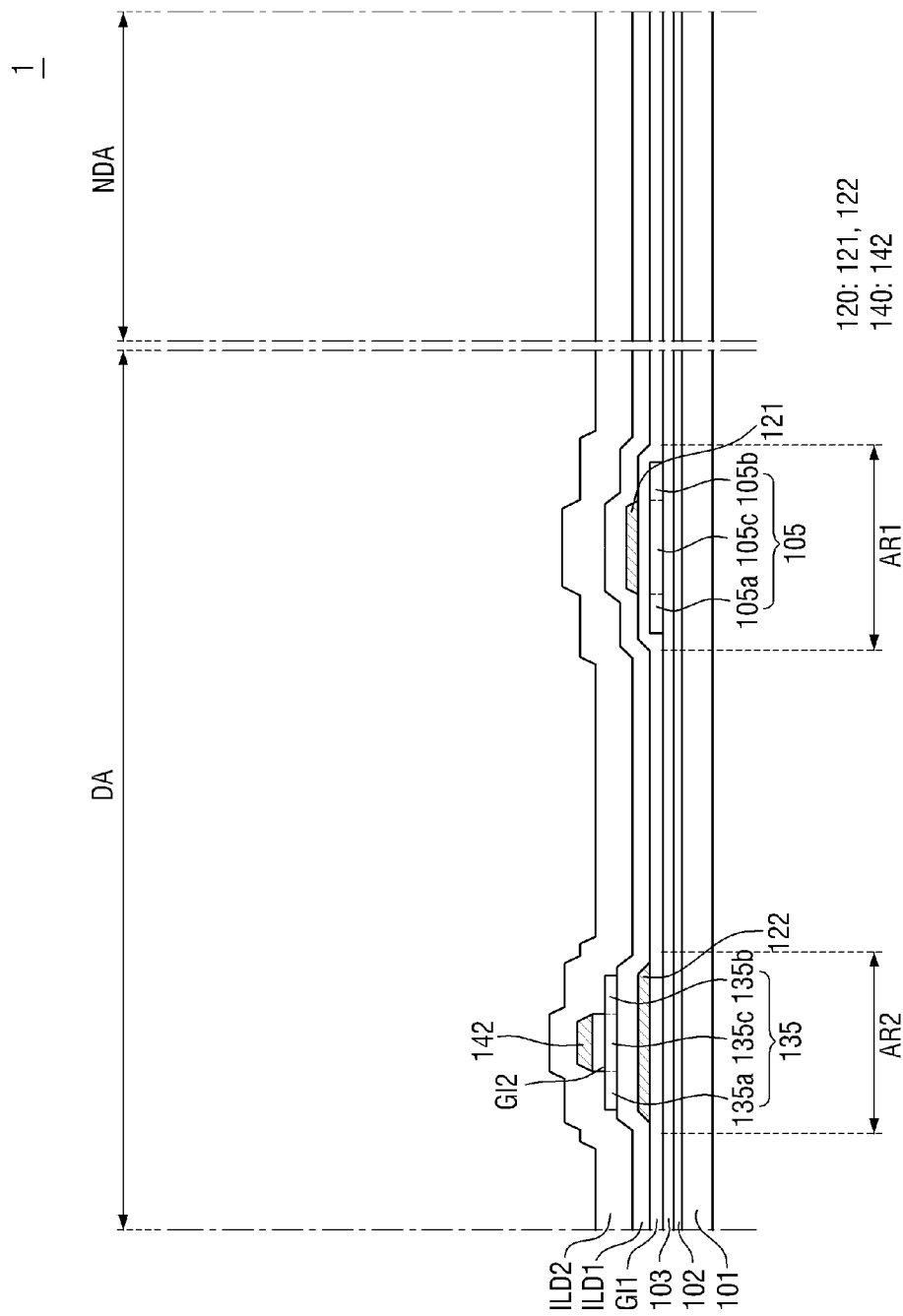
Figure 13:
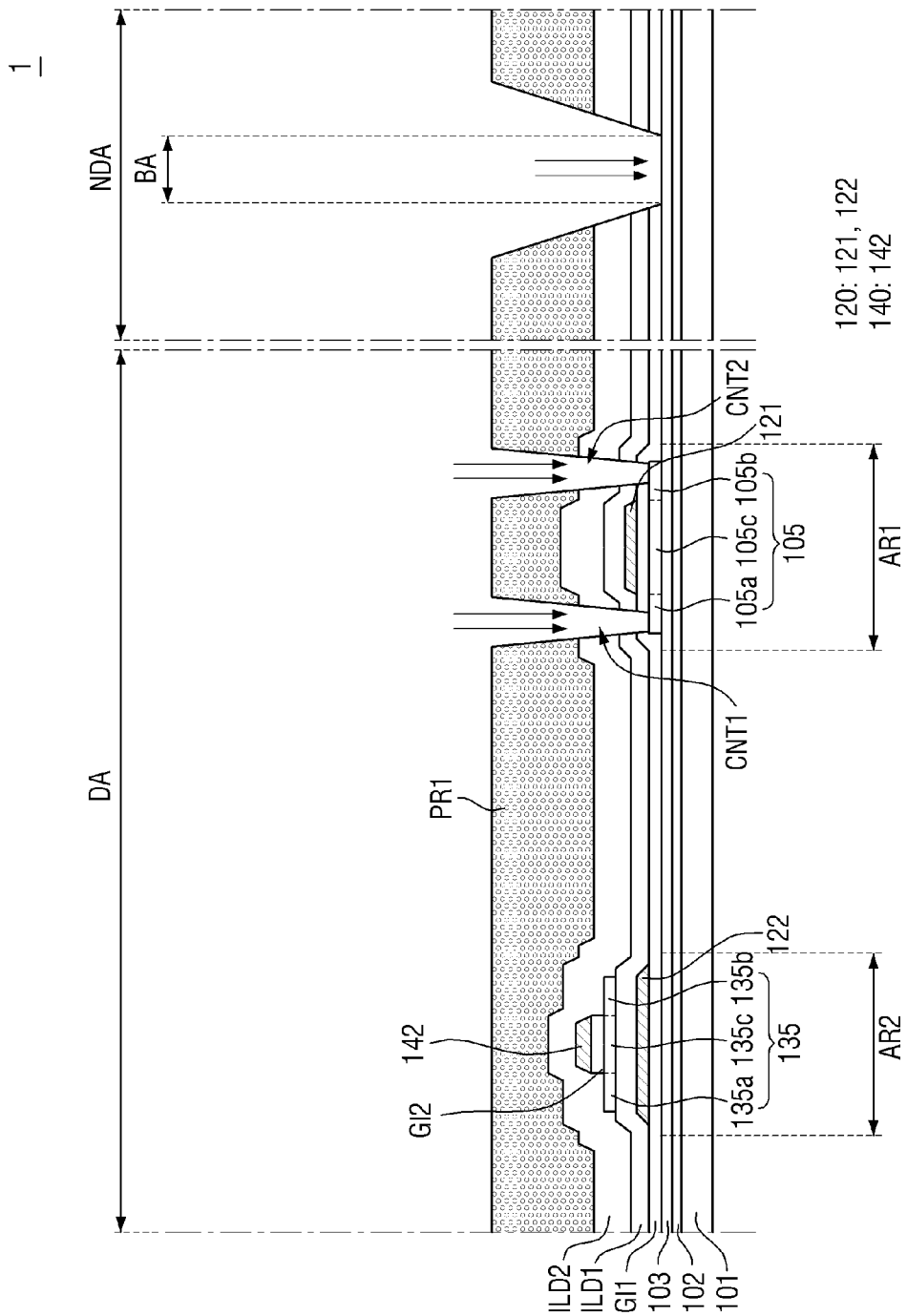

Referring to FIGS. 12 and 13, a second interlayer insulating layer ILD2 may be stacked on the second gate electrode 142, and first and second contact holes CNT1 and CNT2, which may expose a portion of the silicon semiconductor layer 105, may be formed in the display region DA (S05).

The contact holes CNT1 and CNT2 may be formed by one mask process. The first contact hole CNT1 and the second contact hole CNT2 may be simultaneously formed using the same mask. For example, an insulating layer for a second interlayer insulating film may be deposited on an entire surface of the first interlayer insulating film ILD1 on which the oxide semiconductor layer 135, the second gate insulating film GI2, and the second gate electrode 142 may be formed. A first photoresist pattern PR1 which may expose a portion of the silicon semiconductor layer 105 may be formed on the insulating layer for the second interlayer insulating film ILD2, and the insulating layer for the second interlayer insulating film ILD2, the first interlayer insulating film ILD1, and the first gate insulating film GI1 may be etched using the first photoresist pattern PR1 as an etching mask so that the first and second contact holes CNT1 and CNT2 which may expose the portion of the silicon semiconductor layer 105 may be formed.

A bending opening OP2 may be formed in the non-display region NDA by the operation S05 of forming the first contact hole CNT1 and the second contact hole CNT2 and an operation S06 of forming a trench structure OP1 which may expose portions of a third contact hole CNT3, a fourth contact hole CNT4, and the first interlayer insulating layer ILD1, which will be described below, without any additional process, and a portion of the bending opening OP2 may be formed by the operation S05 of forming the first contact hole CNT1 and the second contact hole CNT2.

The first photoresist pattern PR1 may be formed to expose the portion of the silicon semiconductor layer 105 and the bending opening OP2 of the bending region BA. When etching is performed using the first photoresist pattern PR1, the second interlayer insulating film ILD2, the first interlayer insulating film ILD1, and the first gate insulating film GI1 in the bending region BA may be simultaneously etched in the operation S05 of forming the first contact hole CNT1 and the second contact hole CNT2, and thus a portion of the buffer layer 103 in the corresponding region may be exposed. Since the first contact hole CNT1 and the second contact hole CNT2 may be etched to expose the portion of the silicon semiconductor layer 105 in the operation S05, the silicon semiconductor layer 105 may also be partially etched or damaged during the etching process. In order to minimize the damage that may be applied to the silicon semiconductor layer 105, the operation S05 may be performed to etch only the second interlayer insulating film ILD2, the first interlayer insulating film ILD1, and the first gate insulating film GI1 in the bending region BA. Therefore, in the operation S05, the buffer layer 103 of the non-display region NDA may remain without being removed. The process of forming the bending opening OP2 which may expose a surface of the base substrate 101 may be completed by the operation S06 of forming the third contact hole CNT3, the fourth contact hole CNT4, and the trench structure OP1 which will be described below.

Figure 14:
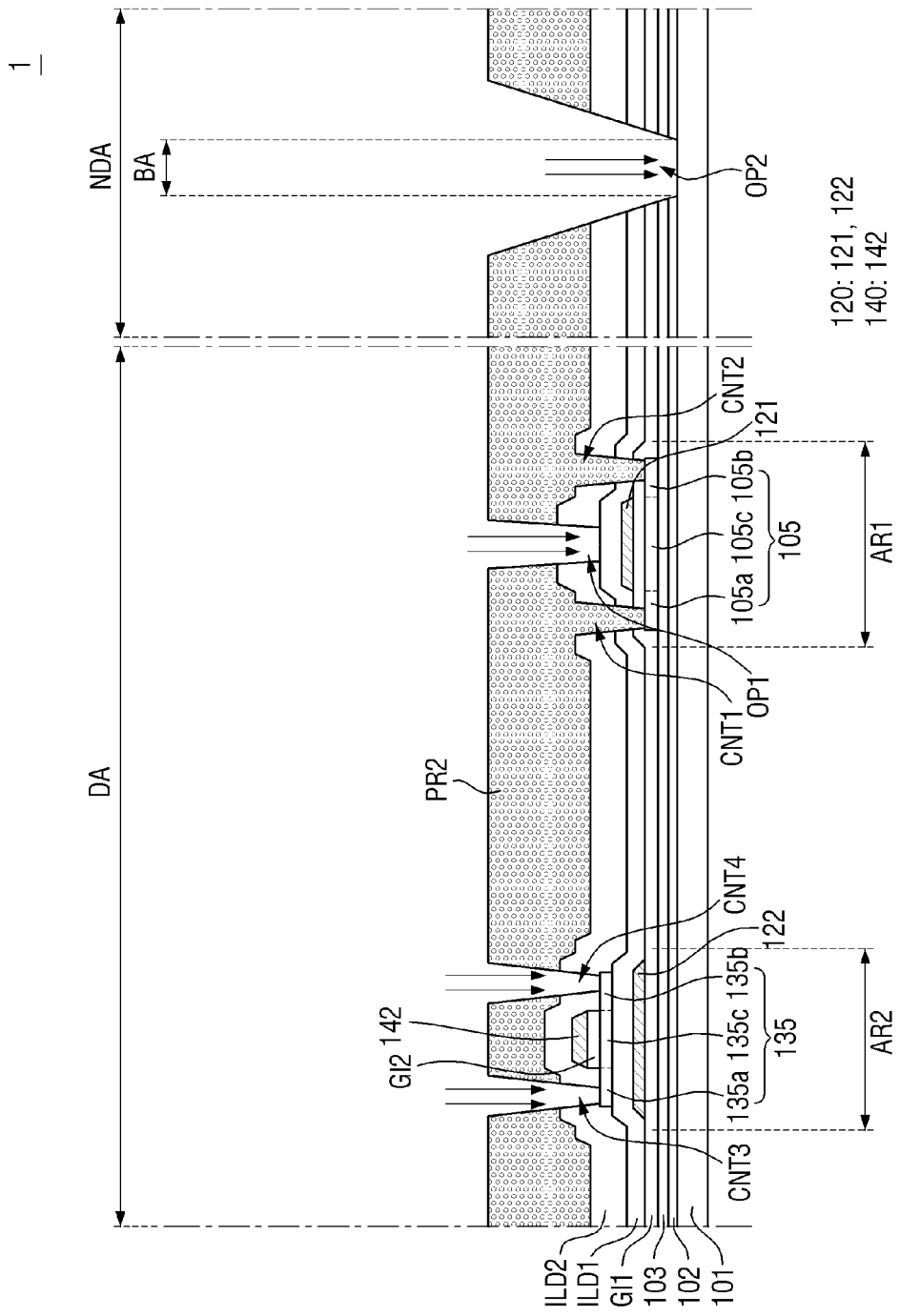

Referring to FIG. 14, the third contact hole CNT3 and the fourth contact hole CNT4 which may expose a portion of the oxide semiconductor layer 135 and the trench structure OP1 which may expose a portion of the first interlayer insulating layer ILD1 may be formed (S06).

The contact holes CNT3 and CNT4, the trench structure OP1, and the bending opening OP2 may be formed by a mask process. The third contact hole CNT3, the fourth contact hole CNT4, and the trench structure OP1 may be simultaneously formed by the same mask. For example, a second photoresist pattern PR2 which may expose a portion of the oxide semiconductor layer 135 and a portion of the first interlayer insulating layer ILD1 may be formed on the second interlayer insulating film ILD2 in which the first contact hole CNT1 and the second contact hole CNT2 may be formed, and the second interlayer insulating film ILD2 may be etched using the second photoresist pattern PR2 as an etching mask so that the third contact hole CNT3 and the fourth contact hole CNT4 which may expose the portion of the oxide semiconductor layer 135 and the trench structure OP1 which may expose the portion of the first interlayer insulating film ILD1 may be formed. By the above process, a portion of an upper side of the first interlayer insulating film ILD1 may also be etched in a region in which the trench structure OP1 may be formed.

The process of forming the bending opening OP2 in the non-display region NDA may be completed by the operation S06. The buffer layer 103 and the barrier layer 102, which are not etched in the operation S05 of forming the first contact hole CNT1 and the second contact hole CNT2, may be etched in the operation S06. Accordingly, the process of forming the bending opening OP2 which may expose the portion of the base substrate 101 may be completed Thicknesses of the buffer layer 103 and the barrier layer 102 may be similar to a thickness of the second interlayer insulating film ILD2. For example, when the buffer layer 103 and the barrier layer 102 are etched, the method of etching both components may be substantially the same as the method of etching the second interlayer insulating film ILD2, and a separate process may be unnecessary. Therefore, the buffer layer 103 and the barrier layer 102 may be etched by the operation S06 so that the process of forming the bending opening OP2 may be completed.

Figure 15:
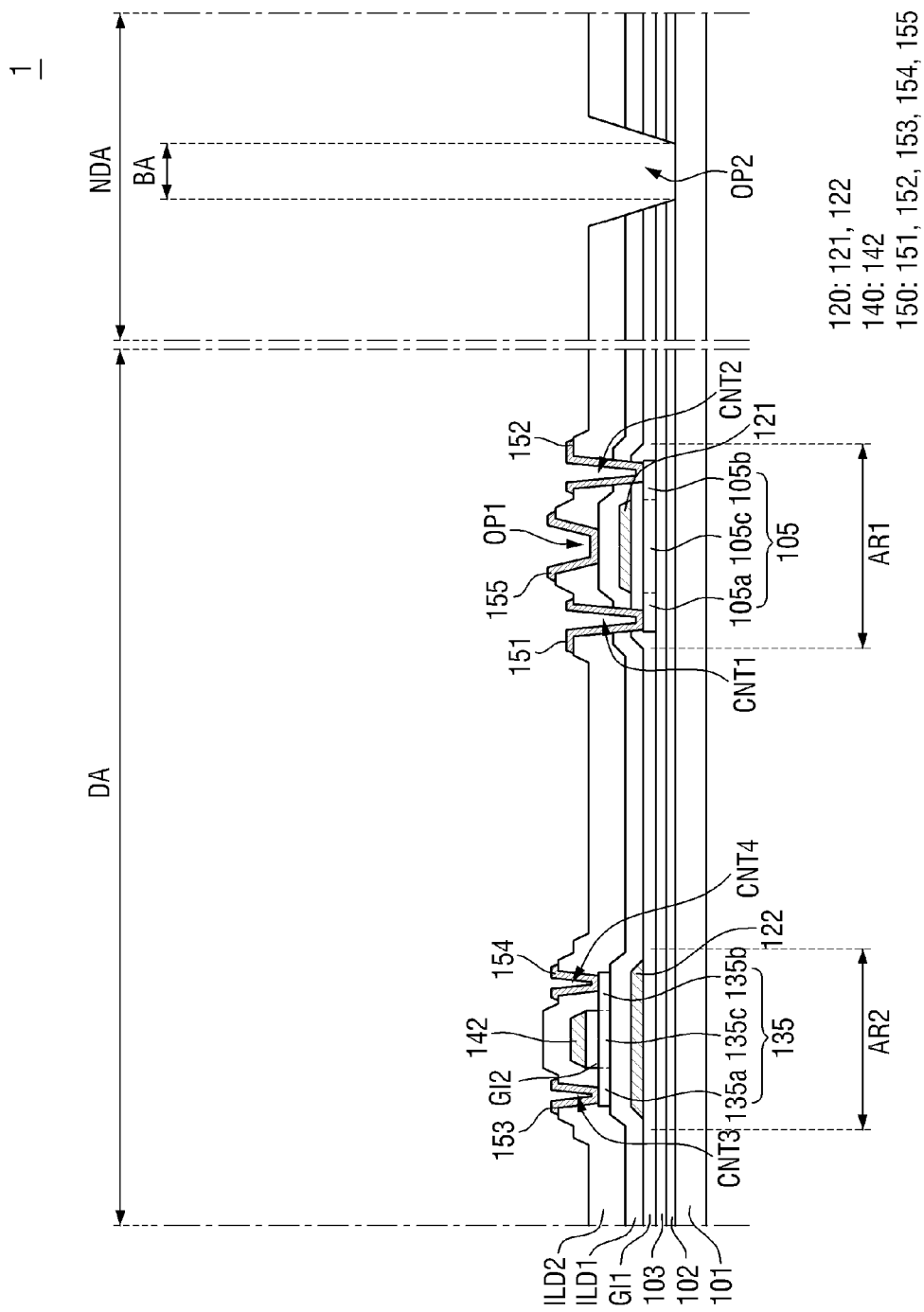

Referring to FIG. 15, the patterned third conductive layer 150 may be formed on the second interlayer insulating film ILD2 (S07). The third conductive layer 150 may include first and second source/drain electrodes 151 and 152 of a transistor located or disposed in the silicon semiconductor region AR1, first and second source/drain electrodes 153 and 154 of a transistor located or disposed in the oxide semiconductor region AR2, and a second electrode 155 of a capacitor Cst. The patterned third conductive layer 150 may be formed by a mask process. For example, a material layer for a third conductive layer may be deposited on an entire surface of the second interlayer insulating film ILD2. In the deposition process, the material layer for the third conductive layer may be located or deposited on the first to fourth contact holes CNT1, CNT2, CNT3, and CNT4 and an inner side of the trench structure OP1. Therefore, the first and second source/drain electrodes 151 and 152 of the transistor located or disposed in the silicon semiconductor region AR1, the first and second source/drain electrodes 153 and 154 of the transistor located or disposed in the oxide semiconductor region AR2, and the second electrode 155 of the capacitor Cst may respectively be connected to the silicon semiconductor layer 105, the oxide semiconductor layer 135, and the first interlayer insulating film ILD1. The material layer for the third conductive layer may be coated with a photoresist layer, a photoresist pattern may be formed by exposure and development, and then the material layer for the third conductive layer may be etched using the photoresist pattern as an etching mask. Thereafter, the photoresist pattern may be removed by a stripping or ashing process and thus the process of forming the patterned third conductive layer 150 is completed as illustrated in FIG. 15.

Figure 16:
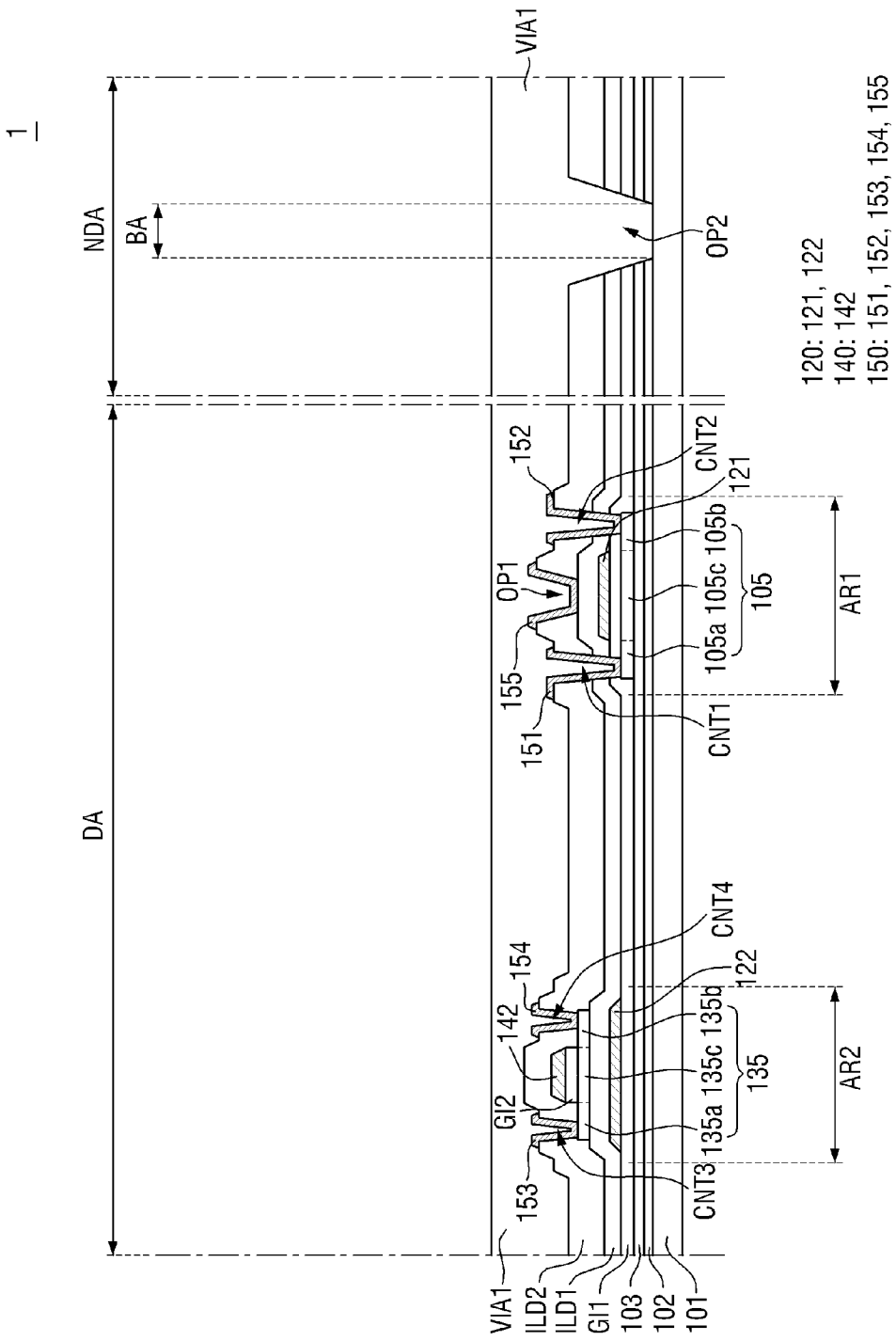
Figure 17:
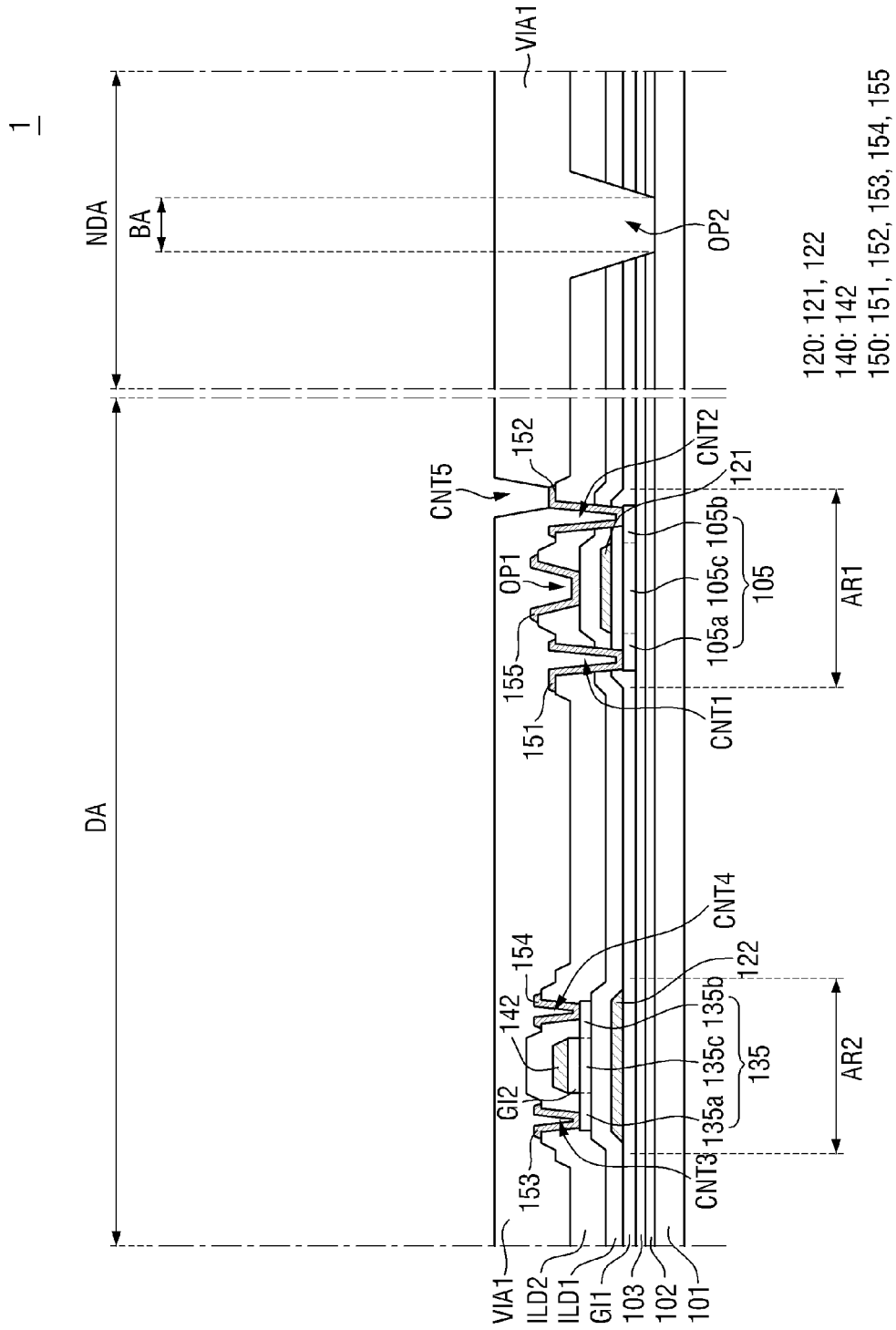

Referring to FIGS. 16 and 17, a first via layer VIA1 may be formed on the third conductive layer 150, and a fifth contact hole CNT5 which may expose portions of the first and second source/drain electrodes 151 and 152 of the transistor located or disposed in the silicon semiconductor region AR1 may be formed (S08).

The first via layer VIA1 may include, for example, an organic material including a photosensitive material. The first via layer VIA1 may be stacked over the display region DA and the non-display region NDA and may have an approximately flat surface. In this case, the bending opening OP2 of the bending region BA of the non-display region NDA may also be filled with the first via layer VIAL An organic material layer for a via layer may be applied on the first via layer VIAL and then the fifth contact hole CNT5 which may expose the portions of the first and second source/drain electrodes 151 and 152 of the transistor located or disposed in the silicon semiconductor region AR1 may be formed by exposure and development.

Figure 18:
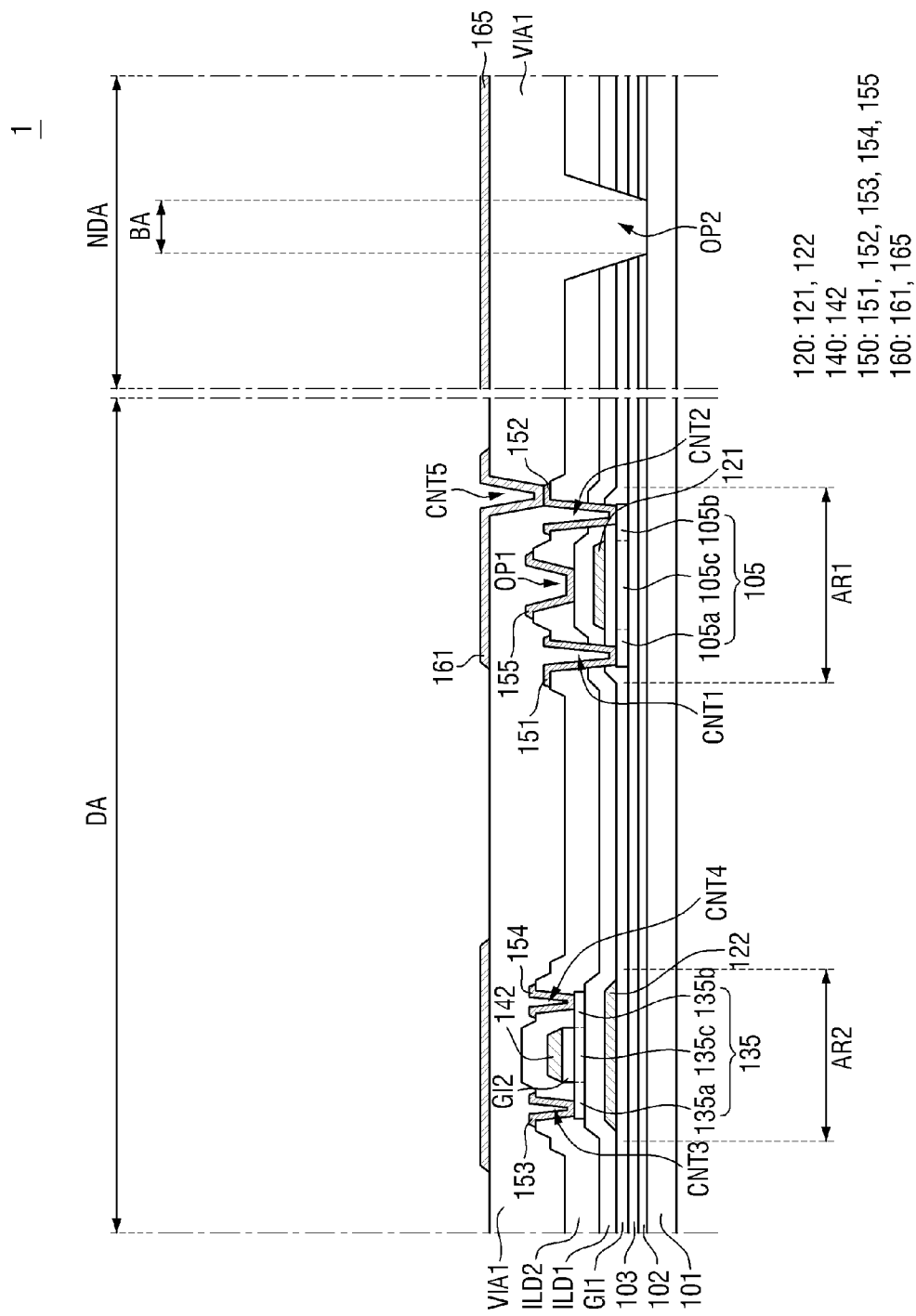

Referring to FIG. 18, a fourth conductive layer 160 may be formed on the first via layer VIA1 (S09).

The fourth conductive layer 160 may include a connection electrode 161 located or disposed in the display region DA and a connection line 165 located or disposed in the non-display region NDA. The patterned fourth conductive layer 160 may be formed by a mask process. For example, a material layer for a fourth conductive layer may be located or deposited on an entire surface of the first via layer VIAL In the deposition process, the material layer for the fourth conductive layer may be deposited on an inner side of the fifth contact hole CNT5. Therefore, the connection electrode 161 may be connected to the first and second source/drain electrodes 151 and 152 of the transistor located or disposed in the silicon semiconductor region AR1. The material layer for the fourth conductive layer may be coated with a photoresist layer, a photoresist pattern may be formed by exposure and development, and then the material layer for the fourth conductive layer may be etched using the photoresist pattern as an etching mask. Thereafter, the photoresist pattern may be removed by a stripping or ashing process, and thus the patterned fourth conductive layer 160 may be completely formed as illustrated in FIG. 18.

Figure 19:
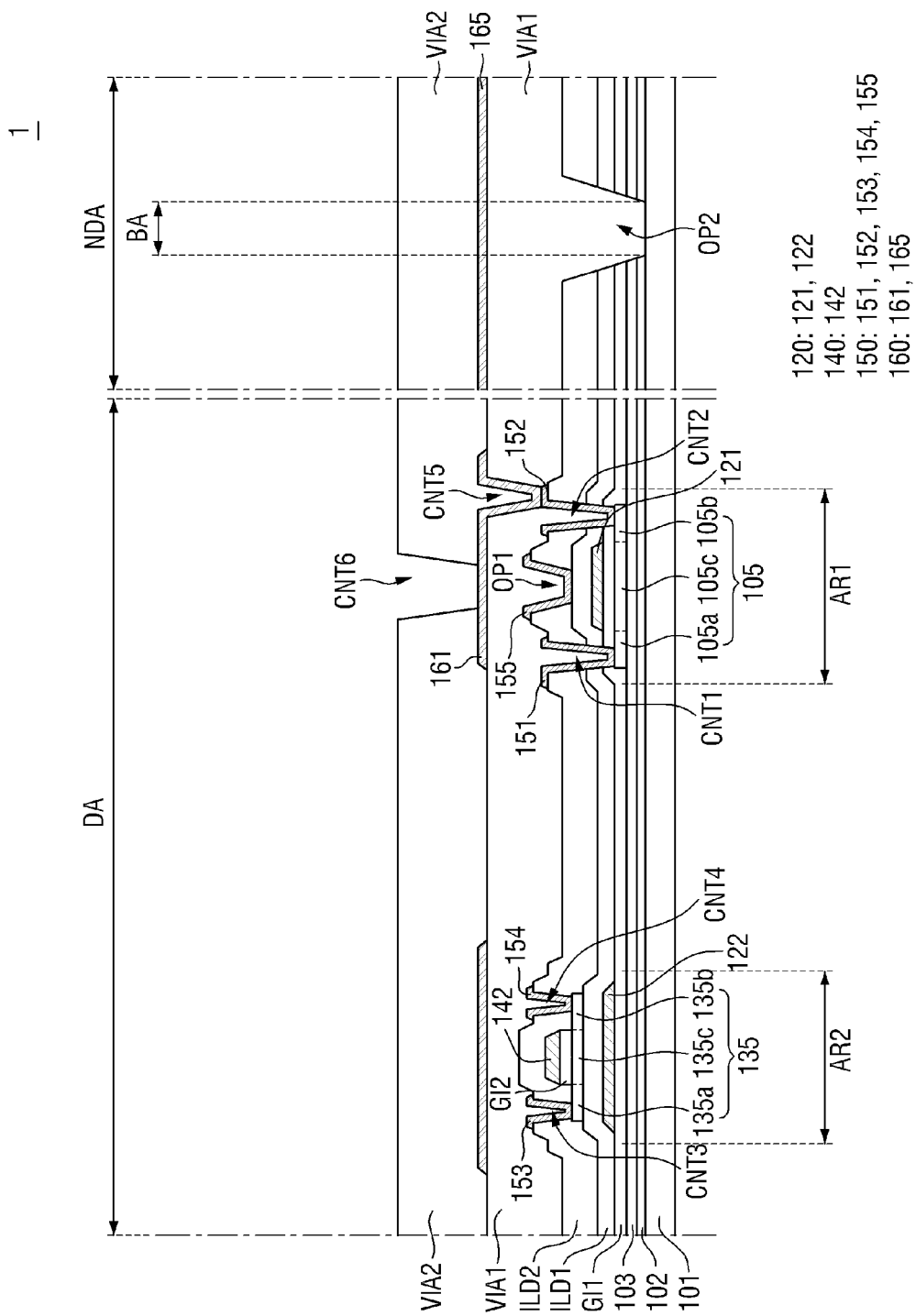

Referring to FIG. 19, a second via layer VIA2 may be formed on the fourth conductive layer 160, and a sixth contact hole CNT6 which may expose a portion of the connection electrode 161 may be formed (S10).

The second via layer VIA2 may include, for example, an organic material including a photosensitive material. The second via layer VIA2 may be stacked in the display region DA or only in the display region DA and may have an approximately flat surface. An organic material layer for a via layer may be applied on the second via layer VIA2, and then the sixth contact hole CNT6 which may expose the portion of the connection electrode 161 may be formed by exposure and development.

Figure 20:
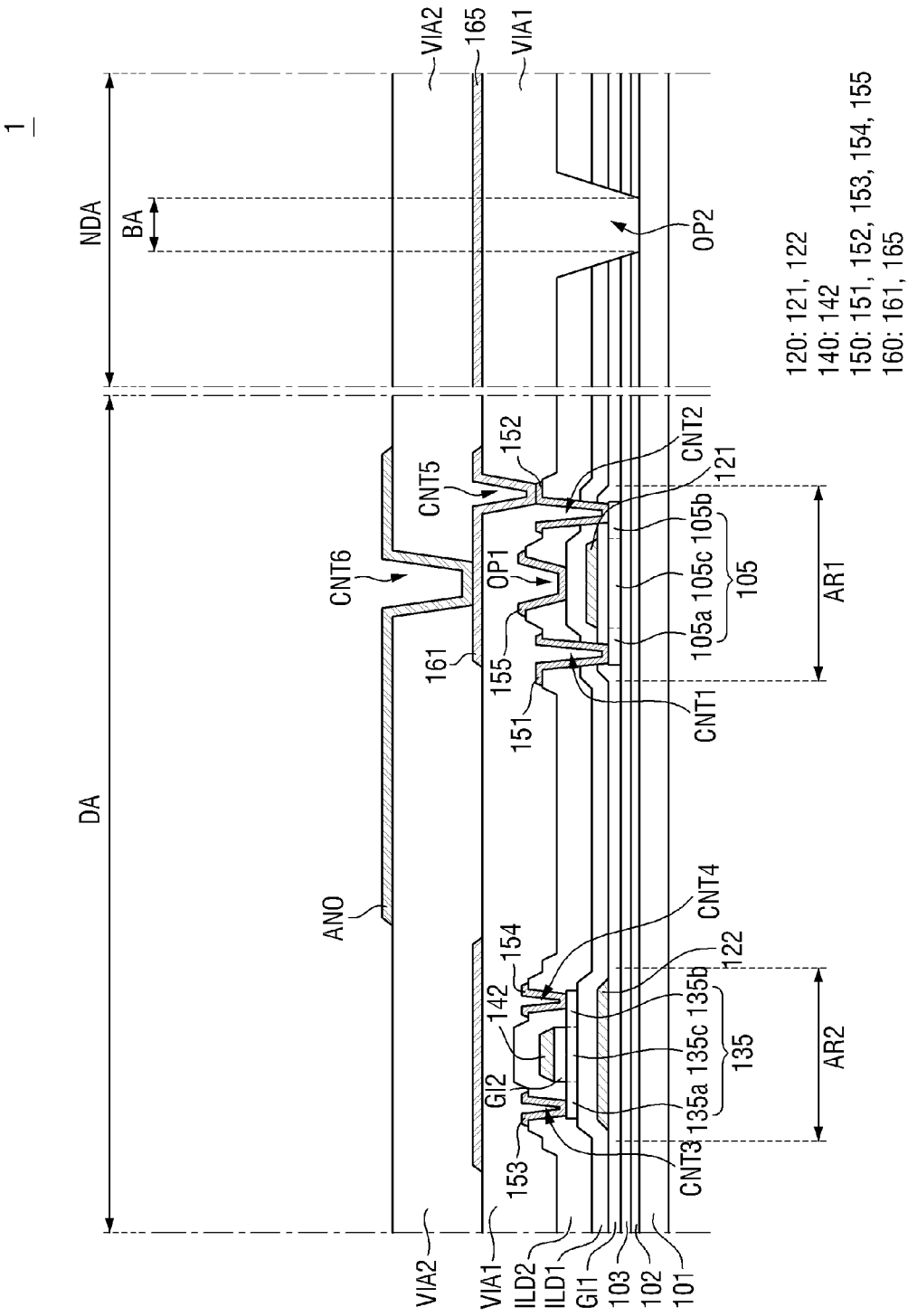

Referring to FIG. 20, an anode electrode ANO may be formed on the second via layer VIA2 (S11).

The patterned anode electrode ANO may be formed by a mask process. For example, a material layer for an anode electrode may be deposited on an entire surface of the second via layer VIA2. In the deposition process, the material layer for the anode electrode may be deposited on an inner side of the sixth contact hole CNT6 and connected to the connection electrode 161.

Figure 21:
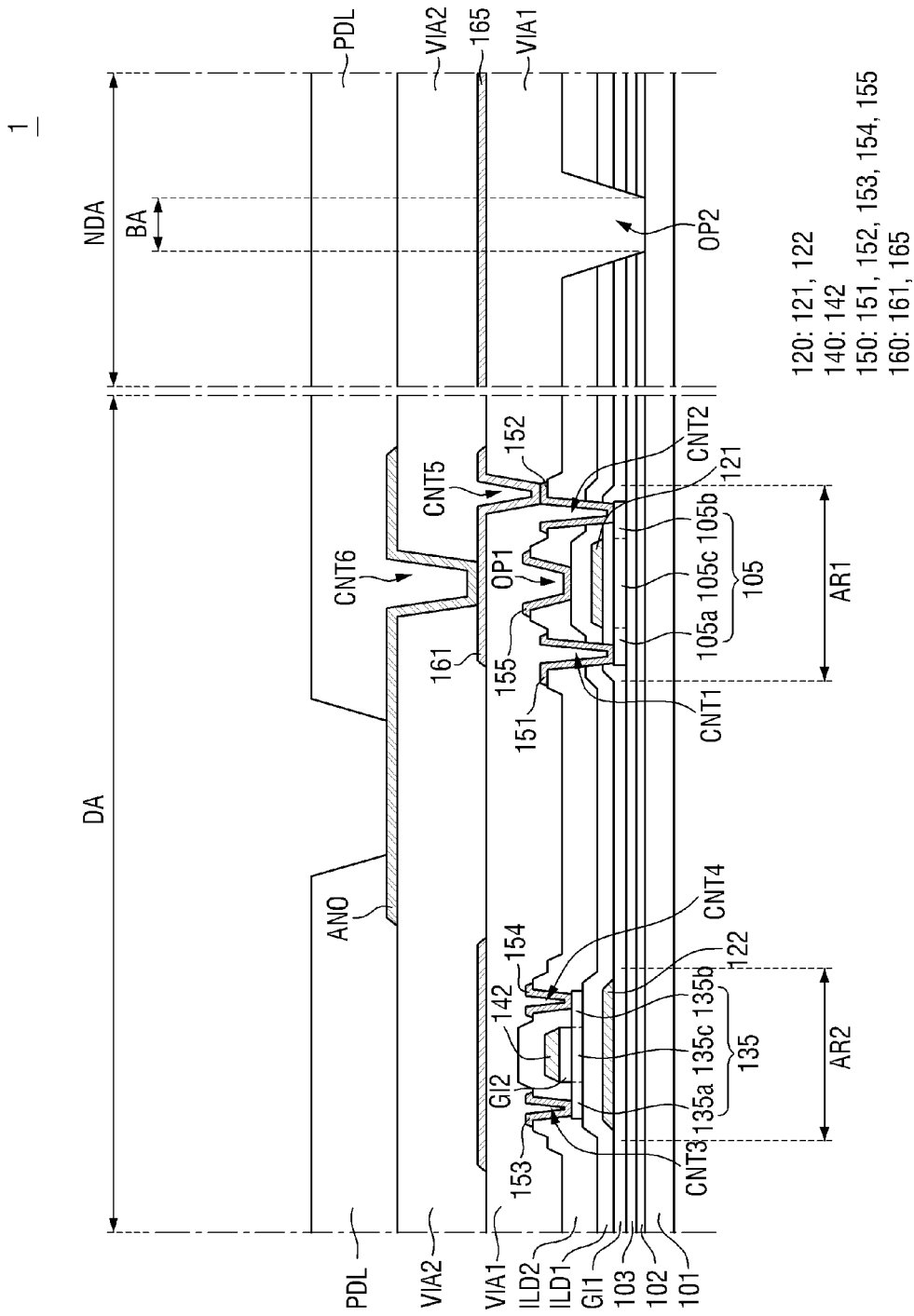

Referring to FIG. 21, a patterned pixel definition film PDL may be formed on the second via layer VIA2 in which the anode electrode ANO may be formed (S12).

The pixel definition film PDL may include, for example, an organic material including a photosensitive material. In this case, the patterned pixel definition film PDL may be formed by applying an organic material layer for a bank layer and then performing exposure and development.

The pixel definition film PDL may be formed along a boundary of the pixel PX and may partially overlap the anode electrode ANO. The pixel definition film PDL may be formed to overlap the sixth contact hole CNT6. When an inner space of the sixth contact hole CNT6 is partially filled with the anode electrode ANO, the inner space of the sixth contact hole CNT6 may be fully filled with the pixel definition film PDL.

As described above, according to an embodiment, a separate mask process for forming one of two electrodes of an organic capacitor Cst is unnecessary. Therefore, the number of mask processes may be reduced and thus process efficiency may be improved.

Hereinafter, other embodiments will be described. In the following embodiments, a description of the same configuration as the above-described embodiment may be omitted or simplified, and differences between the following embodiments and the above-described embodiment will be mainly described.

Figure 22:
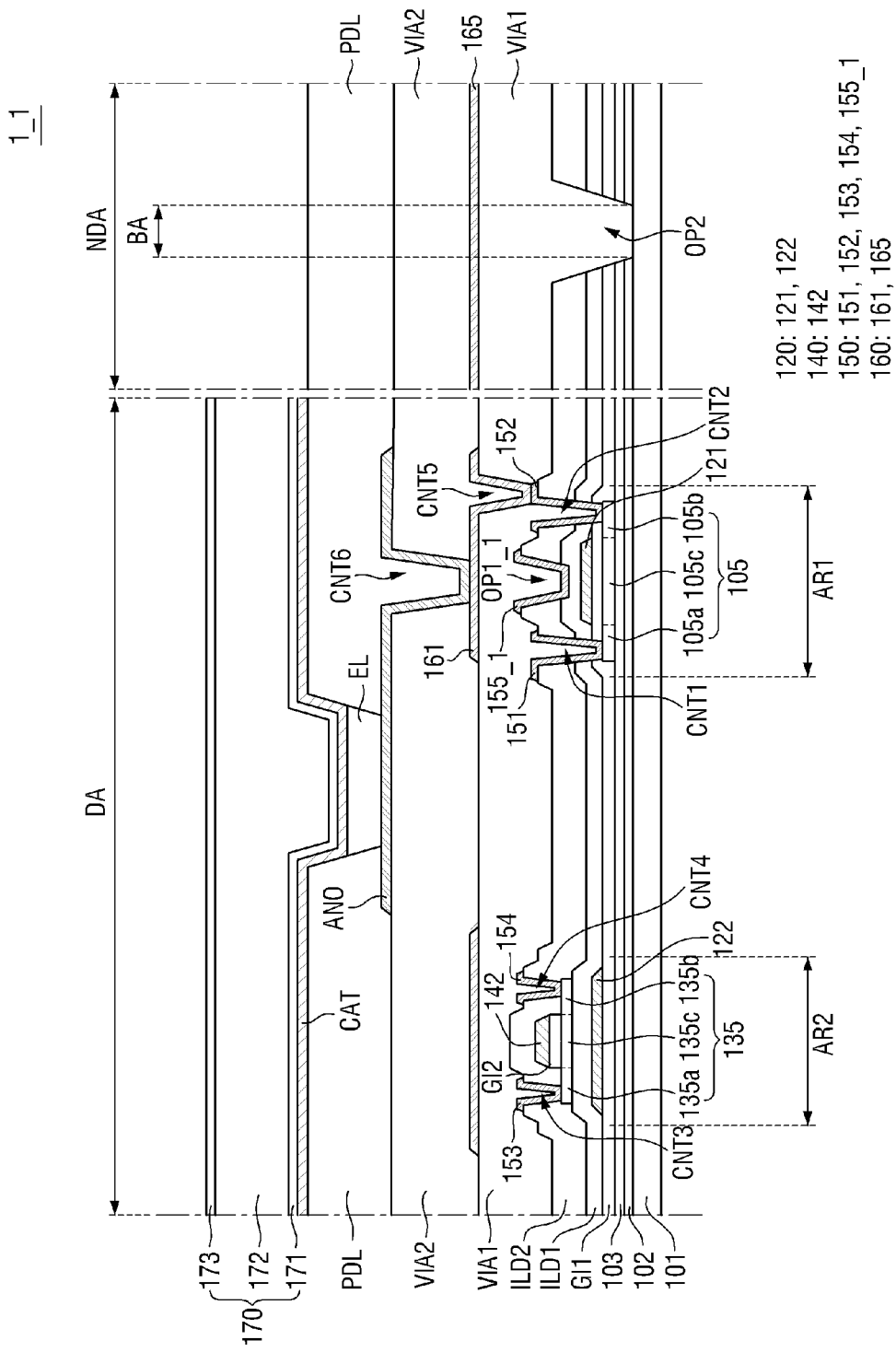
FIG. 22 is a schematic cross-sectional view of a display device according to an embodiment.

FIG. 22 is a schematic cross-sectional view of a display device according to an embodiment.

Referring to FIG. 22, a display device 1_1 according to an embodiment may be different from the display device in the embodiment of FIG. 4 in that a sidewall of a trench structure OP1_1 may include a second interlayer insulating film ILD2 and a portion of a first interlayer insulating film ILD1.

In an etching process for forming the trench structure OP1_1, the exposed first interlayer insulating film ILD1 may be further etched after the second interlayer insulating film ILD2 is etched. In this case, the sidewall of the trench structure OP1_1 may be formed of the second interlayer insulating film ILD2 and the portion of the first interlayer insulating film ILD1. A thickness of the first interlayer insulating film ILD1 between a second electrode 155_1 of a capacitor Cst, which may be formed on the trench structure OP1_1, and a first gate electrode 121 may be smaller or less or thinner than a thickness of another portion of the first interlayer insulating film ILD1.

In the embodiment, an interval between the second electrode 155_1 of the capacitor Cst and a first electrode of the capacitor Cst connected to the first gate electrode 121 may be further reduced and thus the capacitance of the capacitor Cst formed between the two components may be further increased.

Figure 23:
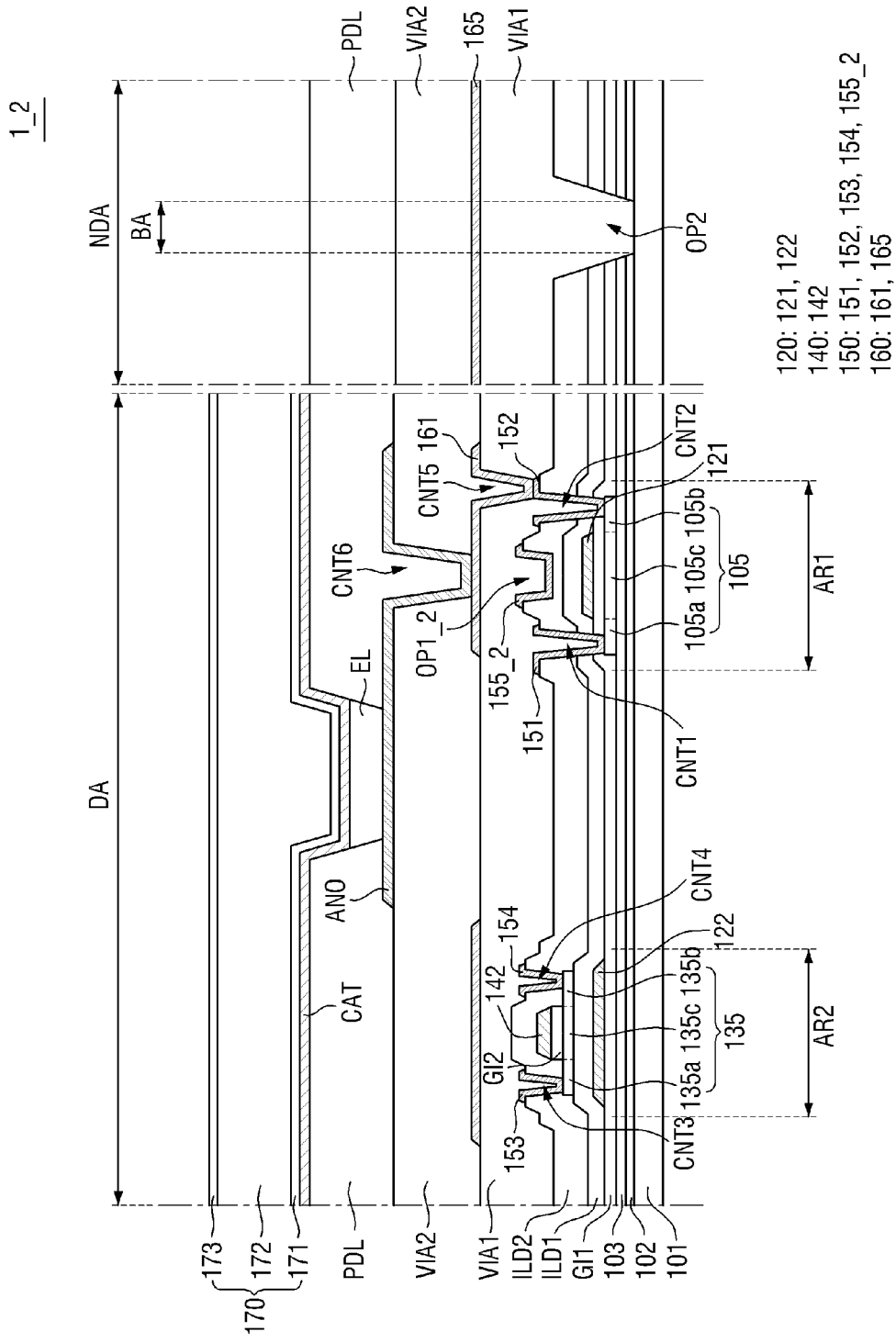
FIG. 23 is a schematic cross-sectional view of a display device according to an embodiment.

FIG. 23 is a schematic cross-sectional view of a display device according to an embodiment.

Referring to FIG. 23, a display device 1_2 according to the embodiment may be different from the display device in the embodiment of FIG. 4 in that a bottom surface of a trench structure OP1_2 may be formed of a second interlayer insulating film ILD2.

In the embodiment, an example in which the second interlayer insulating film ILD2 may not be fully removed when the trench structure OP1_2 may be formed and may remain with a small thickness is illustrated. In this case, the trench structure OP1_2 may have a groove shape on the second interlayer insulating film ILD2 and a sidewall and a bottom surface of the trench structure OP1_2 may be formed of the second interlayer insulating film ILD2.

In the embodiment, a second electrode 155_2 of a capacitor Cst located or disposed in the trench structure OP1_2 may not be in direct contact with an upper surface of a first interlayer insulating film ILD1, and the first interlayer insulating film ILD1 and a portion of the second interlayer insulating film ILD2 may be located or disposed between the second electrode 155_2 of the capacitor Cst and the first gate electrode 121. However, even in this case, a thickness of the second interlayer insulating film ILD2 may be smaller or less or thinner than that in another region so that an interval between the second electrode 155_2 of the capacitor Cst and a first electrode of the capacitor Cst may be reduced.

Figure 24:
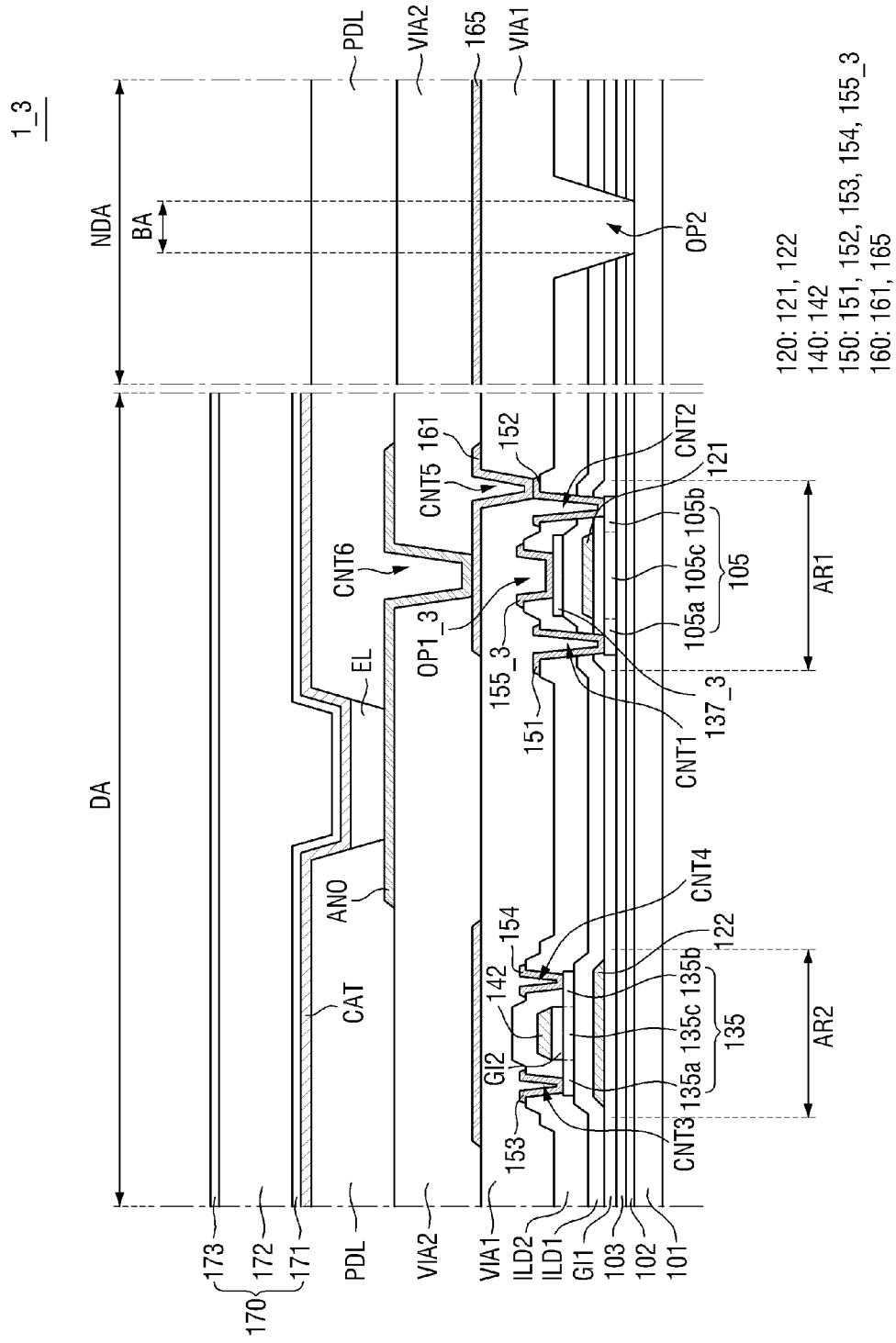
FIG. 24 is a schematic cross-sectional view of a display device according to an embodiment.

FIG. 24 is a schematic cross-sectional view of a display device according to an embodiment.

Referring to FIG. 24, a display device 1_3 according to the embodiment may be different from the display device in the embodiment of FIG. 4 in that the display device 1_3 may include an etch stop pattern 137_3, which may be formed on the same layer as an oxide semiconductor layer 135, between a second electrode 155_3 of a capacitor Cst and a first interlayer insulating film ILD1.

The etch stop pattern 137_3 may be located or disposed between the second electrode 155_3 of the capacitor Cst and the first interlayer insulating film ILD1 in a silicon transistor region AR1 and stacked on the first interlayer insulating film ILD1. Unlike the embodiment of FIG. 4 in which the bottom surface of the trench structure OP1 may be formed of the first interlayer insulating film ILD1, a bottom surface of a trench structure OP1_3 according to the embodiment may be formed of the etch stop pattern 137_3. Therefore, the second electrode 155_3 of the capacitor Cst may not be in direct contact with the first interlayer insulating film ILD1 and may be in direct contact with the etch stop pattern 137_3 located or disposed on the first interlayer insulating film ILD1. The etch stop pattern 137_3 may have a width (or length) greater than that of the trench structure OP1_3 and may protrude outward from at least a sidewall of the trench structure OP1_3.

The etch stop pattern 137_3 may have conductivity greater than that of a channel region 135c of the oxide semiconductor layer 135. The etch stop pattern 137_3 may have the same or similar conductivity as first and second source/drain regions 135a and 135b of the oxide semiconductor layer 135. Therefore, the etch stop pattern 137_3 may serve as an electrode instead of serving as a dielectric of the capacitor Cst. For example, the etch stop pattern 137_3 and the second electrode 155_3 of the capacitor Cst in contact with an upper portion of the etch stop pattern 137_3 may constitute a stacked type second electrode of the capacitor Cst.

The second electrode 155_3 of the capacitor Cst may overlap at least a portion of the etch stop pattern 137_3. In this case, the etch stop pattern 137_3 and the first interlayer insulating film ILD1 may be located or disposed between the second electrode 155_3 of the capacitor Cst and a first gate electrode 121.

The etch stop pattern 137_3 may serve as an etch stopper when forming the trench structure OP1. Therefore, by making a thickness of the dielectric of the capacitor Cst uniform, the uniformity and stability of the capacitor Cst may be further improved.

In the operation S03 of forming the oxide semiconductor layer 135, the etch stop pattern 137_3 and the oxide semiconductor layer 135 may be simultaneously formed by the same mask. Therefore, a material forming the etch stop pattern 137_3 may be identical to a material forming the oxide semiconductor layer 135 and the etch stop pattern 137_3 may be located or disposed on the same layer as a layer on which the oxide semiconductor layer 135 may be located or disposed. Since a separate mask for forming the etch stop pattern 137_3 may be unnecessary, the number of masks required for the process may not increase.

Even in this case, a separate conductive layer may be unnecessary to form the first gate electrode 121 and a capacitor Cst and a mask for forming the separate conductive layer may also be unnecessary, and thus the number of masks required for the process may be reduced.

Figure 25:
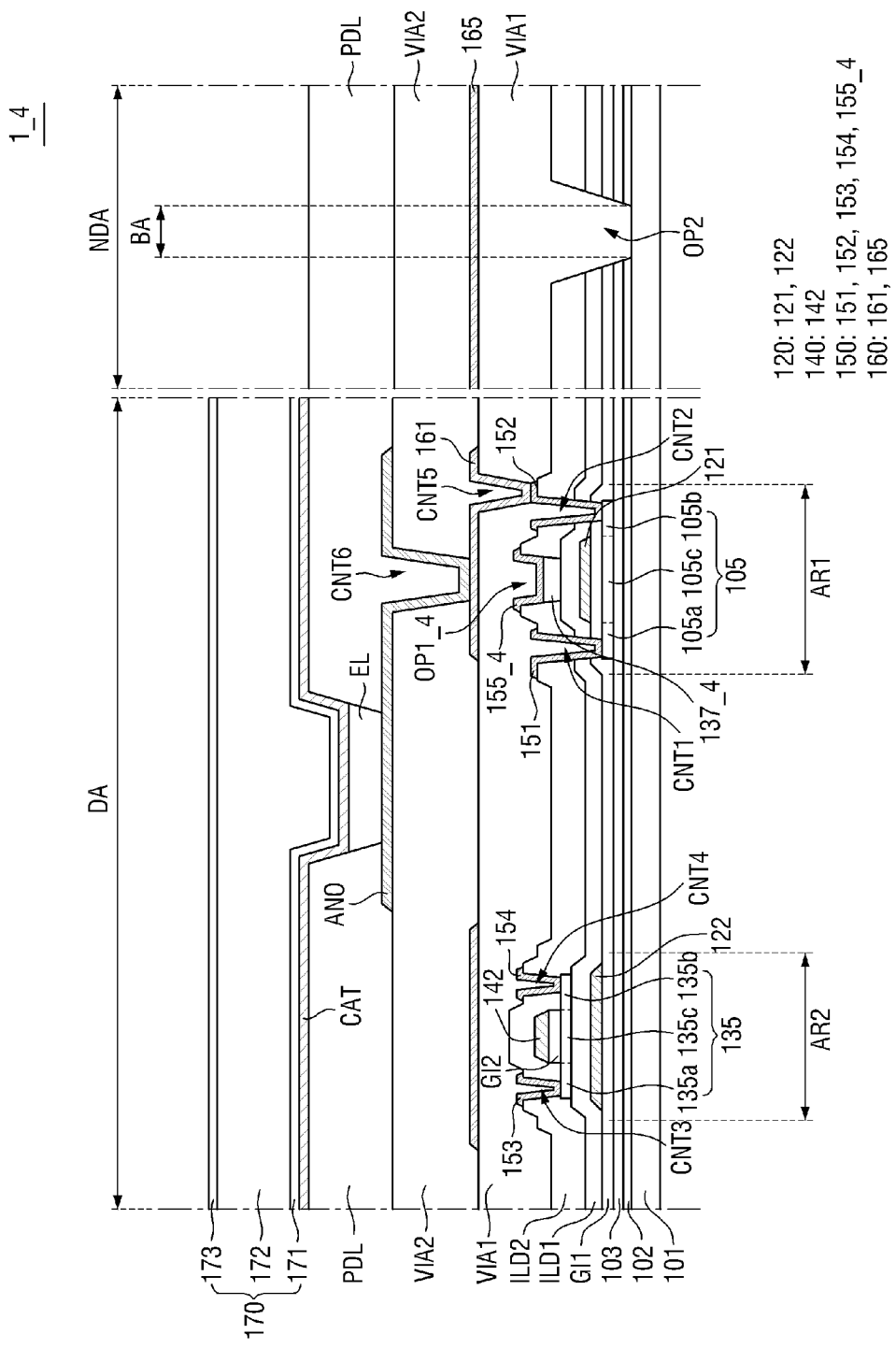
FIG. 25 is a schematic cross-sectional view of a display device according to an embodiment.

FIG. 25 is a schematic cross-sectional view of a display device according to an embodiment.

Referring to FIG. 25, a display device 1_4 according to an embodiment may be different from the display device in the embodiment of FIG. 24 in that a second electrode 155_4 of a capacitor Cst may fully overlap an etch stop pattern 137_4.

In a silicon transistor region AR1, the etch stop pattern 137_4 may be located or disposed between the second electrode 155_4 of the capacitor Cst and a first interlayer insulating film ILD1, the etch stop pattern 137_4 may be stacked on the first interlayer insulating film ILD1, and the second electrode 155_4 of a capacitor Cst may fully overlap the etch stop pattern 137_4. Therefore, the uniformity and stability of the capacitor Cst formed by the second electrode 155_4 of the capacitor Cst and the etch stop pattern 137_4 with a first gate electrode 121 may be further improved.

Even in this case, a separate conductive layer may be unnecessary to form the first gate electrode 121 and a capacitor Cst and a mask for forming the separate conductive layer may also be unnecessary, and thus the number of masks required for the process may be reduced.

Figure 26:
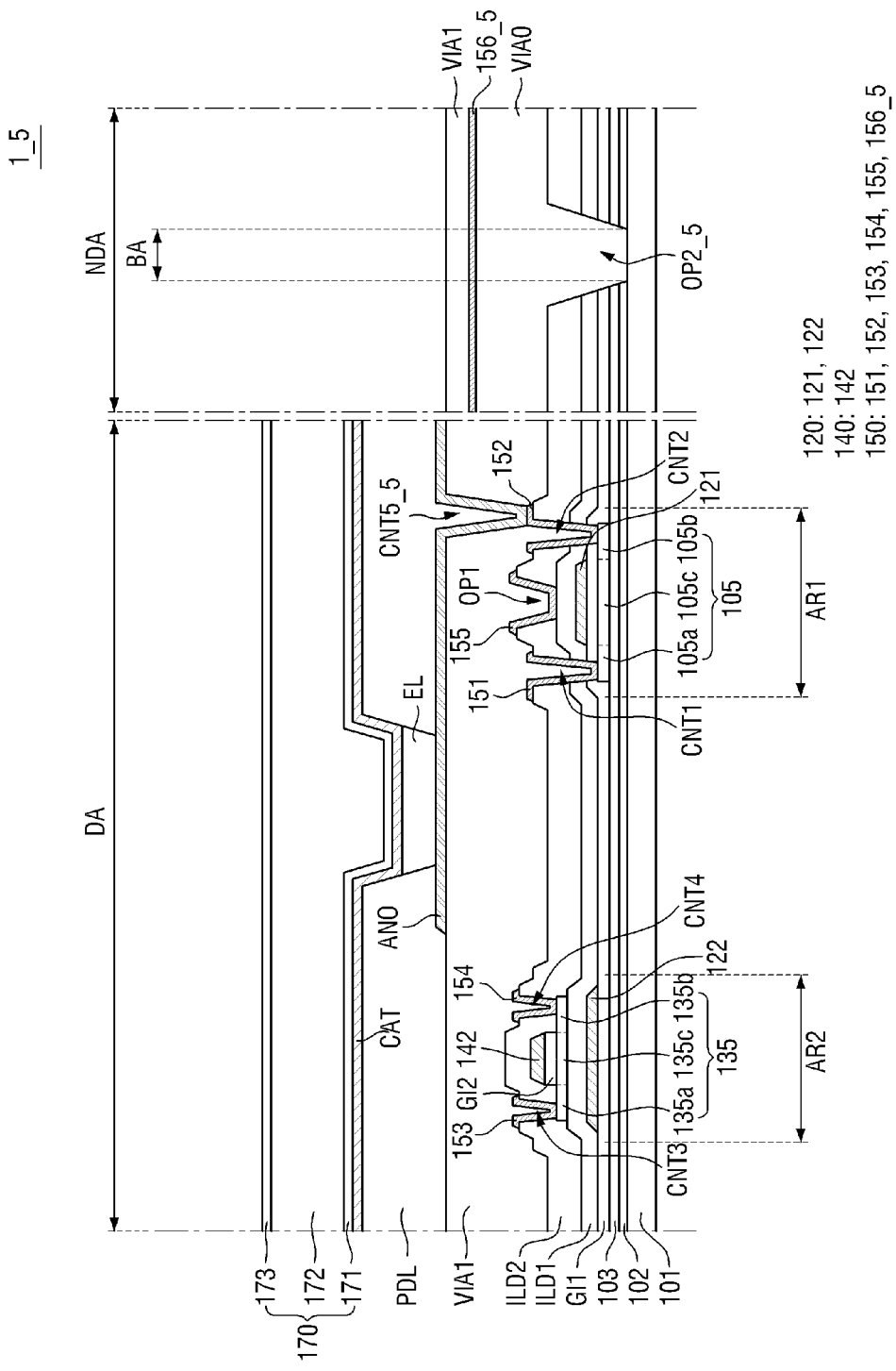
FIG. 26 is a schematic cross-sectional view of a display device according to an embodiment.

FIG. 26 is a schematic cross-sectional view of a display device according to an embodiment.

Referring to FIG. 26, a display device 1_5 according to an embodiment may be different from the display device in the embodiment of FIG. 4 in that the display device 1_5 may not include a second via layer VIA2 and a fourth conductive layer 160 and may include a bending via layer VIA0 in a non-display region NDA.

For example, in the non-display region NDA, a bending opening OP2_5 may be filled with the bending via layer VIA0 rather than a first via layer VIAL The bending via layer VIA0 may include an inorganic insulating material, or an organic insulating material, such as a polyacrylate resin, an epoxy resin, a phenolic resin, a polyamide resin, a polyimide resin, an unsaturated polyester resin, a polyphenylene ether resin, a polyphenylene sulfide resin, BCB, or other material. The bending via layer VIA0 may be a single film or a multilayered film formed as a stacked film of different materials. The bending via layer VIA0 may be made of the same or similar material as the first via layer VIA1, but the disclosure is not limited thereto.

A non-display region line 156_5 may be located or disposed on the bending via layer VIA0. The non-display region line 156_5 may be formed of the third conductive layer 150. The non-display region line 156_5 may be formed together with first and second source/drain electrodes 151 and 152 of a transistor located or disposed in a silicon transistor region AR1, first and second source/drain electrodes 153 and 154 of a transistor located or disposed in an oxide transistor region AR2, and a second electrode 155 of a capacitor Cst which are described above, and may be made of the same or similar material as the materials forming the above components 151, 152, 153, 154, and 155.

The first via layer VIA1 may be located or disposed on the non-display region line 156_5 and the first via layer VIA1 may be formed simultaneously with a first via layer VIA1 of a display region DA to have substantially the same height as a height of the first via layer VIA1 of the display region DA.

In the display region DA, an anode electrode ANO and a pixel definition film PDL may be formed on the first via layer VIA1 and the anode electrode ANO may be stacked in a fifth contact hole CNT5_5.

Even in this case, a separate conductive layer may be unnecessary to form the first gate electrode 121 and a capacitor Cst and a mask for forming the separate conductive layer may also be unnecessary, and thus the number of masks required for the process may be reduced.

Hereinafter, a method of manufacturing the display device according to an embodiment of FIG. 26 will be described.

Figure 27:
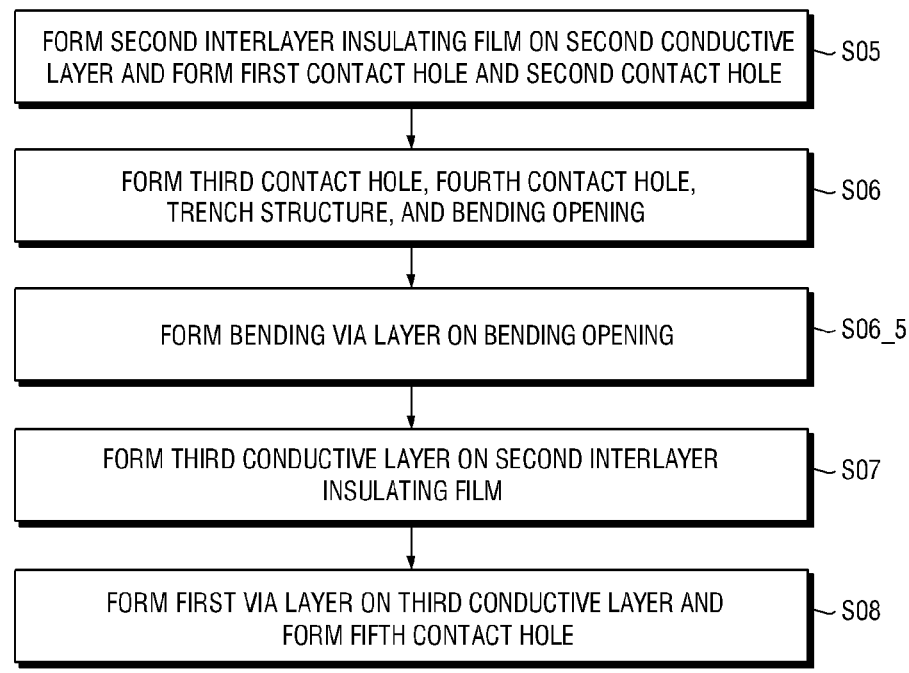
FIG. 27 is a flowchart illustrating a method of manufacturing the display device according to an embodiment of FIG. 26.
Figure 28:
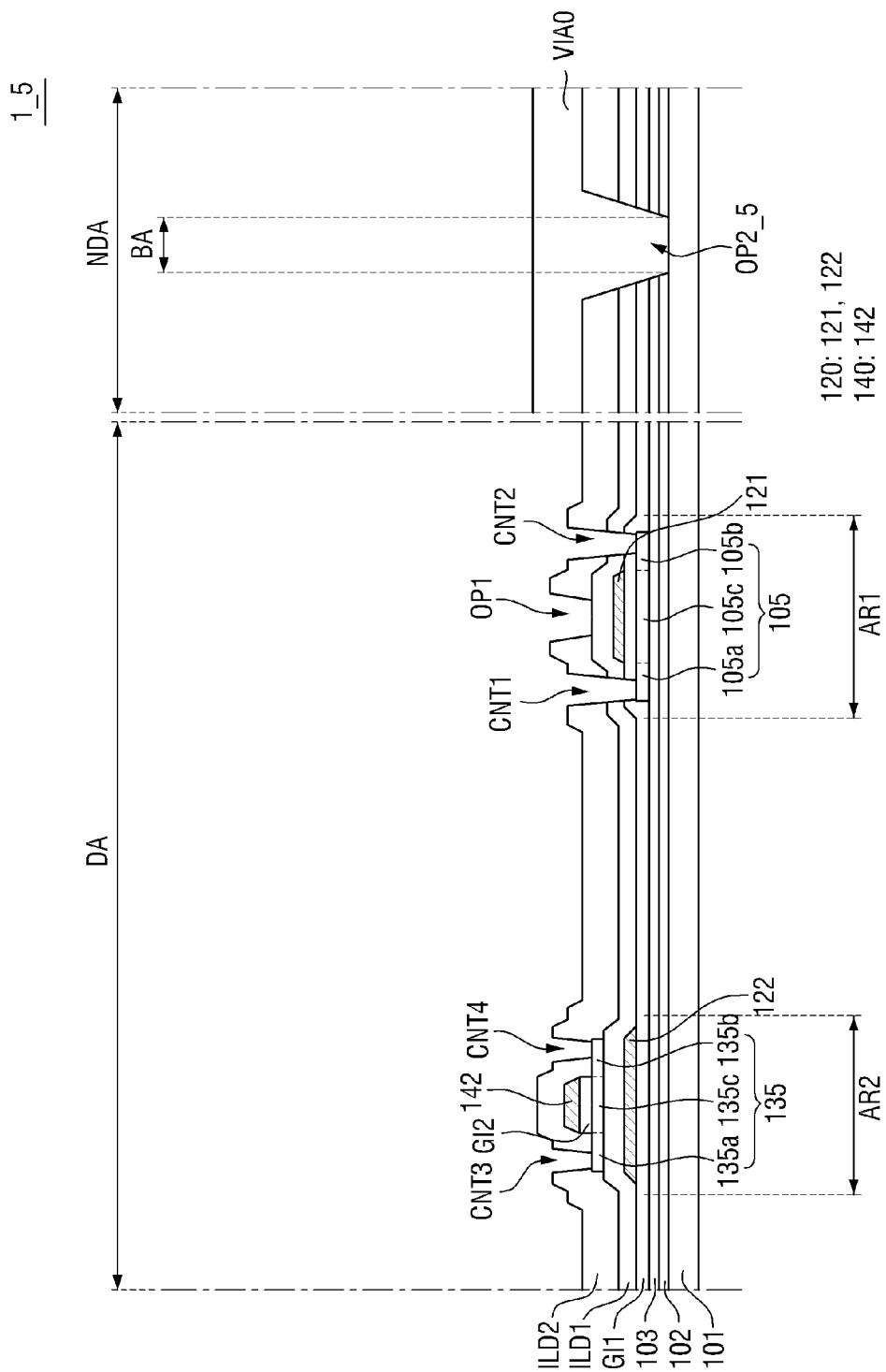
FIGS. 28 to 30 are schematic cross-sectional views illustrating process operations of the method of manufacturing the display device according to an embodiment of FIG. 26.
Figure 29:
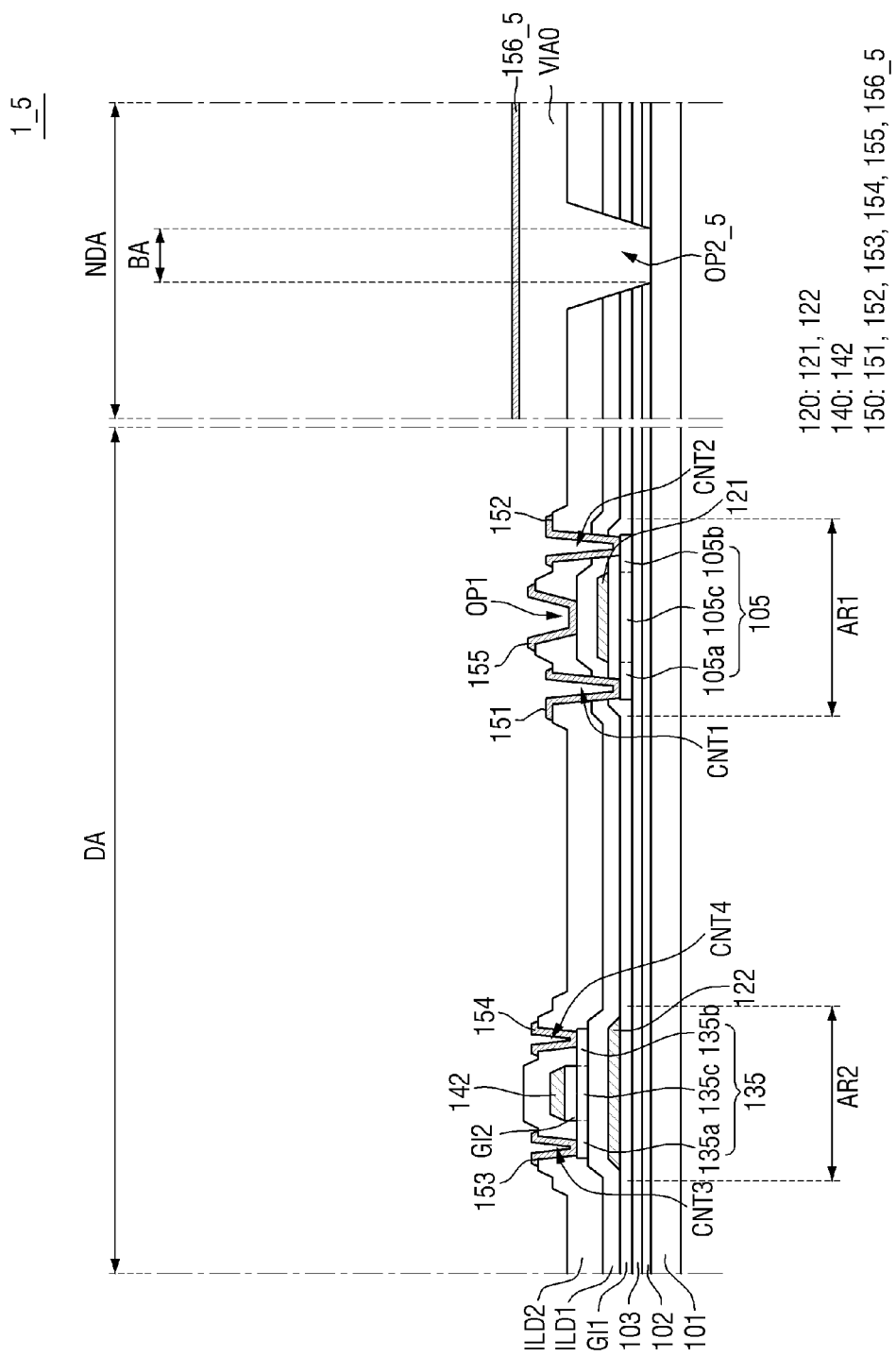
Figure 30:
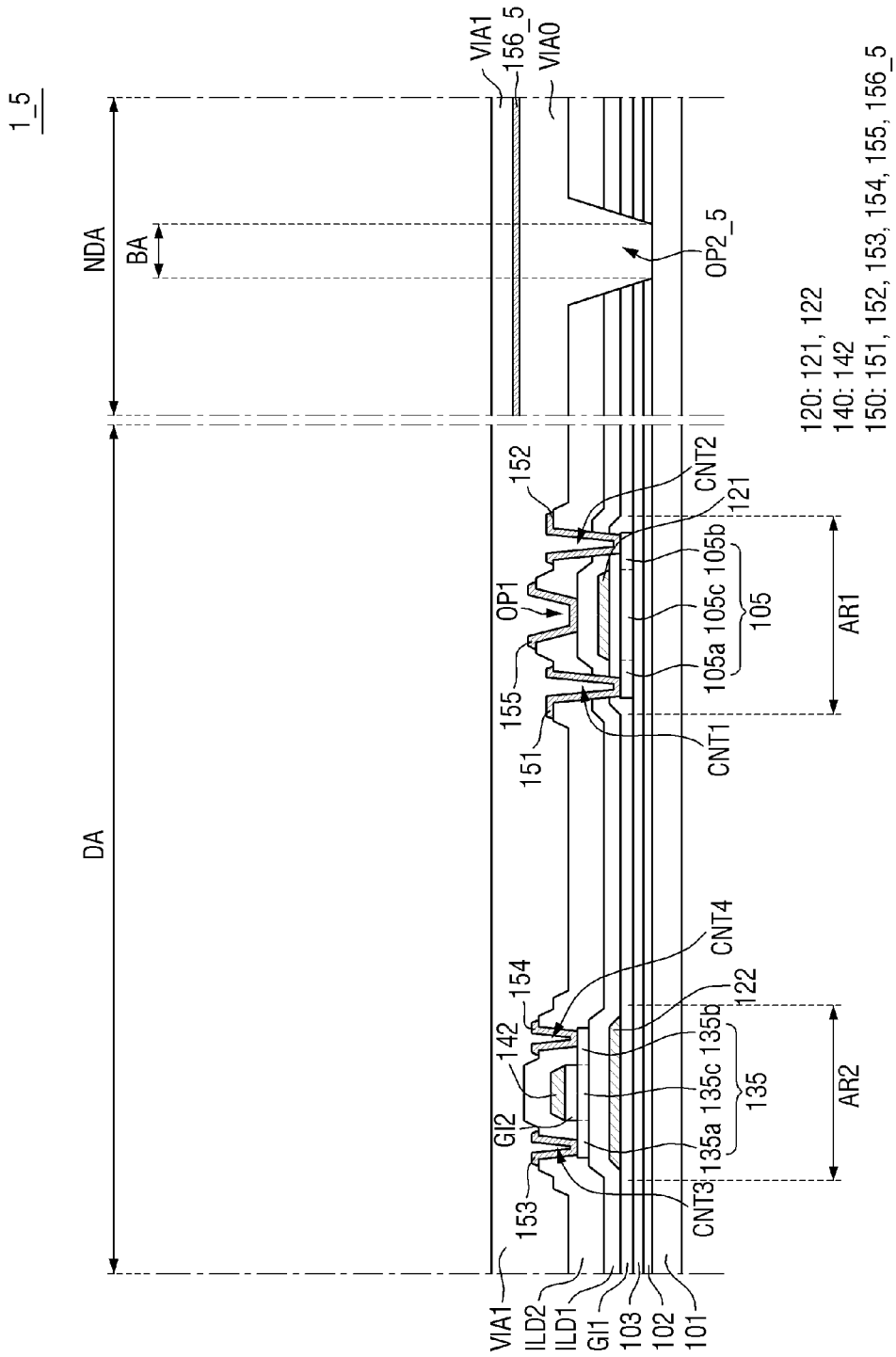

FIG. 27 is a flowchart illustrating the method of manufacturing the display device according to an embodiment of FIG. 26. FIGS. 28 to 30 are schematic cross-sectional views illustrating process operations of the method of manufacturing the display device according to an embodiment of FIG. 26.

Referring to FIGS. 27 and 28, as described above, a bending opening OP2_5 may be formed by operations S05 and S06 of forming first to fourth contact holes CNT1, CNT2, CNT3, and CNT4, a trench structure OP1, and the bending opening OP2_5. After the operations S05 and S06, a bending via layer VIA0 may be formed on the bending opening OP2_5 (S06_5). The bending opening OP2_5 may be filled with the bending via layer VIA0, and the bending via layer VIA0 may be in contact with an upper surface of a base substrate 101 in the bending opening OP2_5 and in contact with side surfaces of a barrier layer 102, a buffer layer 103, a first gate insulating film GI1, a first interlayer insulating film ILD1, and a second interlayer insulating film ILD2 and an upper surface of a second interlayer insulating film ILD2.

Referring to FIGS. 29 and 30, a third conductive layer 150 may be formed on the second interlayer insulating film ILD2 and the bending via layer VIA0 (S07). The third conductive layer 150 may include first and second source/drain electrodes 151 and 152 of a transistor located or disposed in the silicon semiconductor region AR1, first and second source/drain electrodes 153 and 154 of a transistor located or disposed in the oxide semiconductor region AR2, a second electrode 155 of a capacitor Cst, and a non-display region line 156_5 located or disposed on the bending via layer VIA0.

A first via layer VIA1 may be formed on the third conductive layer 150 (S08). The first via layer VIA1 may have the same height in a display region DA and a non-display region NDA.

While the embodiments of the disclosure have been described with reference to the accompanying drawings, it will be understood by those skilled in the art that various modifications may be made without departing from the spirit and scope of the disclosure. Therefore, the above-described embodiments should be considered in a descriptive sense only and not for purposes of limitation.

What is claimed is:

1. A display device comprising:
   a substrate;
   a first semiconductor pattern disposed on the substrate;
   a first gate insulating film disposed on the first semiconductor pattern;
   a first conductive layer disposed on the first gate insulating film and including:
   a first gate electrode; and
   a first electrode of a capacitor connected to the first gate electrode;
   a first interlayer insulating film disposed on the first conductive layer;

a second semiconductor pattern disposed on the first interlayer insulating film;

a second gate insulating film disposed on the second semiconductor pattern;

a second gate electrode disposed on the second gate insulating film;

a second interlayer insulating film disposed on the second gate electrode; and a second conductive layer disposed on the second interlayer insulating film and including:
a first source/drain electrode;
a second source/drain electrode; and
a second electrode of the capacitor, wherein the second electrode of the capacitor is disposed in a trench structure in which the second interlayer insulating film is partially removed.

2. The display device of claim 1, wherein the first interlayer insulating film is disposed between the first electrode and the second electrode of the capacitor without the second interlayer insulating film.

3. The display device of claim 2, wherein a thickness of the first interlayer insulating film between the first electrode and the second electrode of the capacitor is less than a thickness of the first interlayer insulating film in a region in which the first interlayer insulating film does not overlap the second conductive layer.

4. The display device of claim 1, wherein a thickness of the second interlayer insulating film between the first electrode and the second electrode of the capacitor is less than a thickness of the second interlayer insulating film in a region in which the second interlayer insulating film does not overlap the second conductive layer.

5. The display device of claim 1, wherein:
a sidewall of the trench structure is formed of the second interlayer insulating film; and
a bottom surface of the trench structure is formed of a portion of the first interlayer insulating film.

6. The display device of claim 1, wherein a sidewall and a bottom surface of the trench structure is formed of the second interlayer insulating film.

7. The display device of claim 1, further comprising a light-shielding pattern which is coplanar with the first gate electrode and overlaps the second semiconductor pattern.

8. The display device of claim 7, wherein the light-shielding pattern is connected to the second gate electrode or is connected to one of the first and second source/drain electrodes.

9. The display device of claim 1, further comprising a third semiconductor pattern,
wherein a bottom surface of the trench structure is formed of the third semiconductor pattern, and the third semiconductor pattern is in contact with the second electrode of the capacitor and is disposed between the second electrode of the capacitor and the first interlayer insulating film.

10. The display device of claim 9, wherein the second semiconductor pattern includes:
a channel region which overlaps the second gate electrode; and
a source/drain region disposed on an outer side of the second gate electrode, and
the source/drain region and the third semiconductor pattern have a conductivity greater than that of the channel region.

11. The display device of claim 10, wherein the third semiconductor pattern has a same conductivity as the source/drain region.

12. A display device comprising:
a first transistor including a non-oxide semiconductor;
a second transistor including an oxide semiconductor disposed on a different layer from the non-oxide semiconductor; and
a capacitor,
a first conductive layer including a first electrode of the capacitor and a gate electrode of the first transistor;
a second conductive layer including a gate electrode of the second transistor; and
a third conductive layer including a source/drain electrode of the first transistor, a source/drain electrode of the second transistor, and a second electrode of the capacitor; wherein the second electrode of the capacitor is disposed in a trench structure formed of an insulating layer, and
the second electrode of the capacitor is further disposed on a top surface of the insulating layer outside the ten structure.

13. The display device of claim 12, wherein
one of the first transistor and the second transistor is a p-type metal-oxide-semiconductor (PMOS) transistor, and
the other thereof is an n-type metal-oxide-semiconductor (NMOS) transistor.

14. The display device of claim 12, wherein
the insulating layer includes:
a first insulating layer; and
a second insulating layer disposed on the first insulating layer, and
the trench structure includes:
a side wall formed of the second insulating layer; and
a bottom surface formed of a portion of the first insulating layer.

* * * * *